(12) United States Patent
Gibson

(10) Patent No.: US 8,368,421 B2
(45) Date of Patent: Feb. 5, 2013

(54) MICROMAGNETIC ELEMENTS, LOGIC DEVICES AND RELATED METHODS

(75) Inventor: Ursula J. Gibson, Etna, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 516 days.

(21) Appl. No.: 12/377,078

(22) PCT Filed: Aug. 10, 2007

(86) PCT No.: PCT/US2007/075737
§ 371 (c)(1),
(2), (4) Date: Apr. 23, 2010

(87) PCT Pub. No.: WO2008/022042
PCT Pub. Date: Feb. 21, 2008

(65) Prior Publication Data
US 2010/0232219 A1    Sep. 16, 2010

Related U.S. Application Data

(60) Provisional application No. 60/836,821, filed on Aug. 10, 2006, provisional application No. 60/858,009, filed on Nov. 9, 2006.

(51) Int. Cl.
*H03K 19/195* (2006.01)

(52) U.S. Cl. ........................................................ 326/6

(58) Field of Classification Search ................... 365/171, 365/66, 129, 130, 158, 173
See application file for complete search history.

(56) References Cited

U.S. PATENT DOCUMENTS

| | | | | |
|---|---|---|---|---|
| 6,906,369 B2 * | 6/2005 | Ross et al. | ..................... | 257/295 |
| 7,102,477 B2 * | 9/2006 | Bland et al. | ..................... | 335/302 |
| 2003/0161179 A1 * | 8/2003 | Bloomquist et al. | .......... | 365/171 |
| 2009/0273972 A1 * | 11/2009 | Han et al. | ..................... | 365/173 |

OTHER PUBLICATIONS

Qureshi et al., "Cavity-enhanced Kerr Effect for Magneto-Optic Spectroscopy of Nanostructures" Nanotechnlogy, 2003, IEEE-Nano 2003, 2003 Third IEEE Conference on Aug. 12-14, 2003, Piscataway, NJ, USA,IEEE, vol. 1, Aug. 12, 2003, pp. 175-178, XP010657999 ISBN: 0-7803-7976-4.*

* cited by examiner

*Primary Examiner* — Hoai V Ho
*Assistant Examiner* — Pablo Huerta
(74) *Attorney, Agent, or Firm* — Lathrop & Gage LLP

(57) ABSTRACT

Micromagnetic elements, logic devices and methods of fabricating and using them to store data and perform logic operations are disclosed. Micromagnetic elements for data storage, as well as those providing output from a logic device, are at least partially covered with an optical coating that facilitates determination of the magnetic state. The disclosed logic devices perform one or more of AND, OR, NAND and NOR operations.

19 Claims, 18 Drawing Sheets

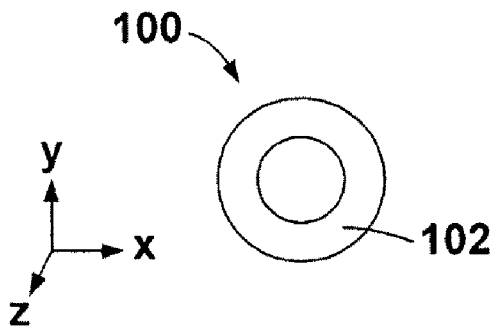
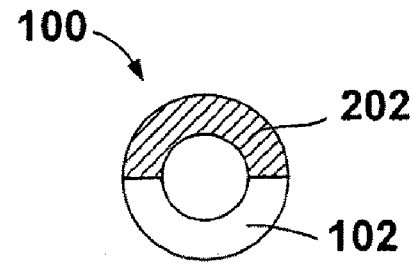
FIG. 1     FIG. 2
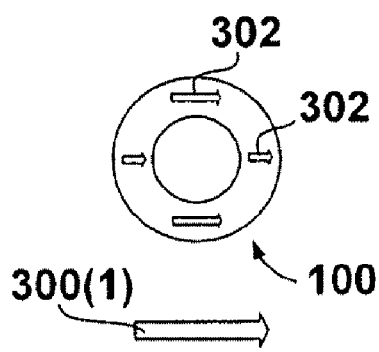
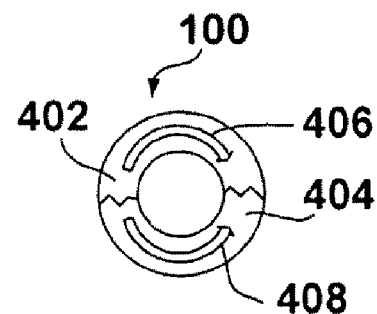
FIG. 3     FIG. 4
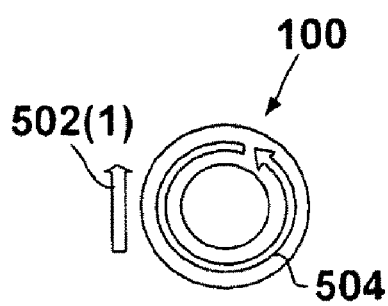
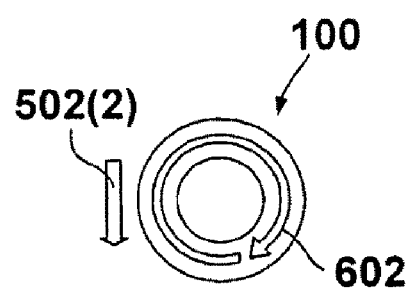
FIG. 5     FIG. 6

2000

```
┌─────────────────────────────┐
│ Provide a first external    │
│ magnetic field to           │──── 2002
│ magnetically saturate the   │
│ micromagnetic elements of a │
│ logic device                │
└─────────────────────────────┘
              │
              ▼
┌─────────────────────────────┐
│ Reduce/remove the first     │
│ external magnetic field     │──── 2004
│ thereby forcing the         │
│ micromagnetic elements to   │
│ adopt onion configurations  │
└─────────────────────────────┘
              │
              ▼
┌─────────────────────────────┐
│ Apply a second external     │
│ magnetic field proximal to  │
│ a micromagnetic element to  │
│ induce a clockwise or       │
│ counter clockwise vortex    │──── 2006
│ state in a first            │
│ micromagnetic element and   │
│ an opposite vortex state in │
│ a second micromagnetic      │
│ element                     │
└─────────────────────────────┘
```

*FIG. 20*

ZrO2 coating thickness

MICROMAGNETIC ELEMENTS, LOGIC DEVICES AND RELATED METHODS

RELATED APPLICATIONS

This application claims the benefit of priority to commonly-owned U.S. Provisional Patent Application Nos. 60/836,821, filed 10 Aug. 2006, and 60/858,009, filed 9 Nov. 2006, each of which is incorporated herein by reference.

GOVERNMENT INTERESTS

The United States Government may have certain rights in the present invention as research relevant to its development was funded by the National Institute of Standards and Technology (NIST) contract number 60NANB2D0120.

BACKGROUND

The possibility of using magnetic elements for computation has been of recent interest. Computers using magnetic processors would have the potential for low power requirements, and indefinite data retention during power interruptions. Some Magnetoresistive Random Access Memory (MRAM)-based reconfigurable logic elements have been developed. For example, Ney et al., Nature, 425(6957): 485-487, 2003 reported MRAM-based devices where a tunneling current travels through a barrier layer between a high coercivity (hard) layer and a low coercivity (soft) layer. In Ney's system, signal contrast results from the relative alignment of the magnetization (parallel or antiparallel) in the hard and soft layers. Reconfiguration of the gate is possible using strip lines. However, in all of these MRAM systems, good signal contrast relies on the formation of thin tunnel barriers, which are susceptible to chemical degradation, defect formation and electromagnetic pulse (EMP) damage. In other work, magnetic systems using either domain wall motion or flipping of dipole states have been used to process binary data.

A vortex magnetization state that closes on itself, most often in a ring-shaped structure, exhibits excellent stability once the magnetization is written into the material. The closed loop structure has very symmetric fields and thus, does not affect nearby elements significantly. Multiple elements may therefore be arranged in close proximity to one another with an ultimate area density approximated at 400 Gbits/in$^2$. However, the low leakage fields of these elements can make it difficult or impossible to detect the direction of the vortices (i.e., the stored bits of "1" and "0") using conventional magneto-optical readout methods.

Readout from planar magnetic devices is typically accomplished using either a polarized Magneto-Optic Kerr Effect (MOKE) signal from the entire device or Magnetic Force Microscopy signals from local regions. MOKE is a non-contact optical technique that uses either a polar, longitudinal or transverse light beam. A small portion of the incident light beam undergoes a polarization rotation upon reflection, and this polarization rotation is proportional to magnetization and off-diagonal elements of the sample's dielectric matrix. The polar Kerr effect has been used in magneto-optic storage applications, but for the examination of in-plane magnetization, the longitudinal or transverse Kerr effect must be used, despite the inherently small signal associated with each of these geometries.

SUMMARY

In one embodiment, a micromagnetic element includes a magnetic film having a width of one micrometer or less, and an optical coating that covers at least a portion of the magnetic film.

In one embodiment, a micromagnetic logic device includes a plurality of micromagnetic elements that are physically linked to one another, and at least one of the micromagnetic elements includes an optical coating covering at least a portion of the micromagnetic element.

In one embodiment, a method of forming a micromagnetic logic device includes providing a plurality of interconnected micromagnetic elements on a substrate and coating at least a portion of one of the micromagnetic elements with an optical coating.

In one embodiment, a method of using a micromagnetic logic device to perform a logic operation includes: providing a first external magnetic field having a first direction of magnetization, the first external magnetic field magnetically saturating a first micromagnetic element and a second micromagnetic element of the logic device, the first micromagnetic element and the second micromagnetic element are joined; reducing the first external magnetic field, thereby forcing the first and second micromagnetic elements to adopt onion configurations; and applying a second external magnetic field proximal to the first micromagnetic element, the second external magnetic field having a direction of magnetization that is perpendicular to the first direction of magnetization, thereby inducing a clockwise or counter clockwise vortex state in the first micromagnetic element and an opposite vortex state in the second micromagnetic element.

In one embodiment, a method for detecting a magnetic state of a micromagnetic element includes applying an optical coating to at least a portion of the micromagnetic element, measuring an optical signal received from the micromagnetic element, and determining the magnetic state of the micromagnetic element based upon the measured signal.

BRIEF DESCRIPTION OF THE DRAWINGS

FIGS. 1-2 show an exemplary micromagnetic element, according to an embodiment.

FIGS. 3-6 show exemplary magnetization states of the micromagnetic element of FIGS. 1-2.

FIG. 20 shows an exemplary process for performing a logic operation using a micromagnetic logic device, according to an embodiment.

DETAILED DESCRIPTION

Figure 7:
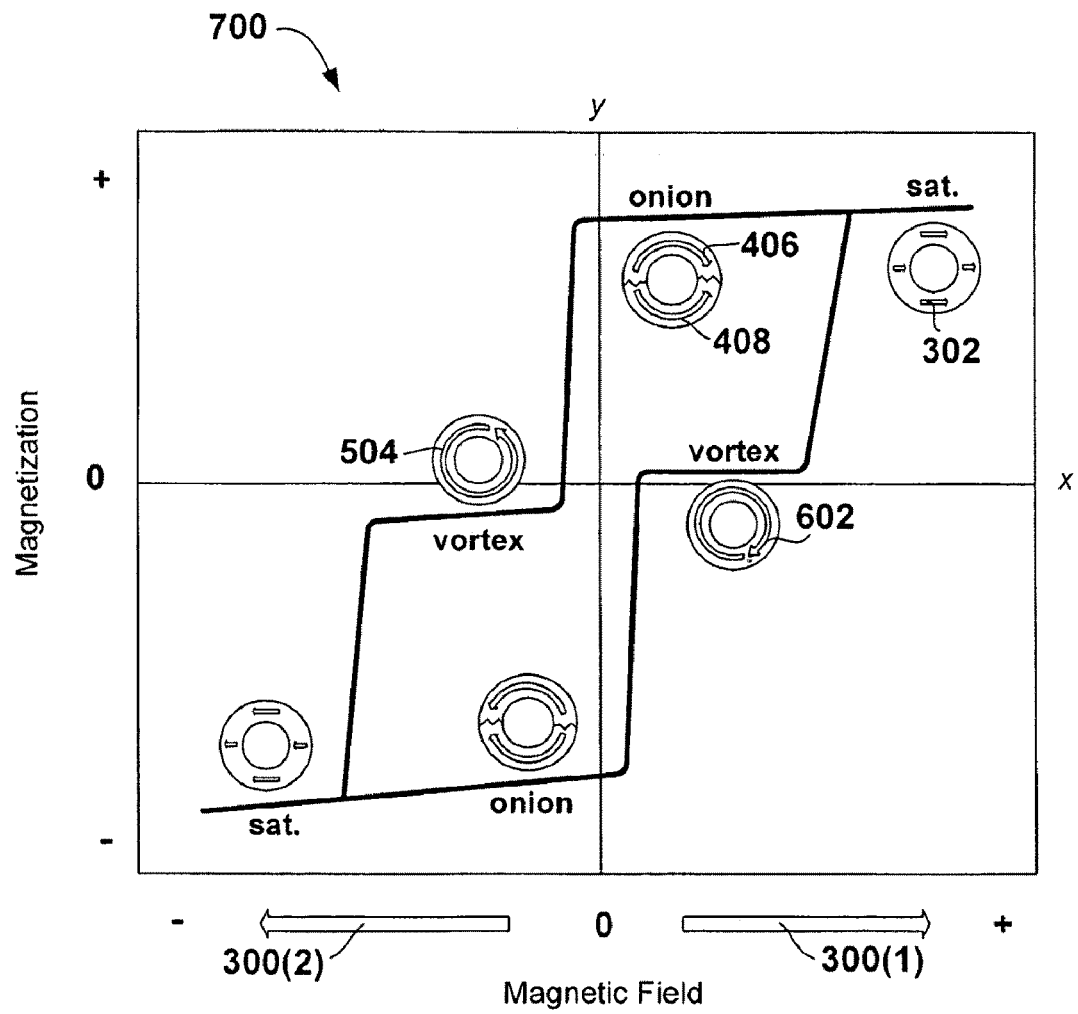
FIG. 7 shows a magnetic hysteresis loop for the micromagnetic element of FIGS. 1-6.
Figure 8:
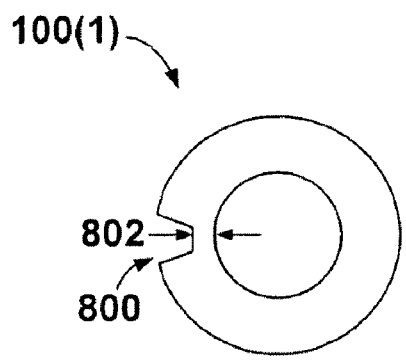
FIGS. 8-11 show exemplary micromagnetic elements configured with structural defects, according to multiple embodiments.
Figure 9:
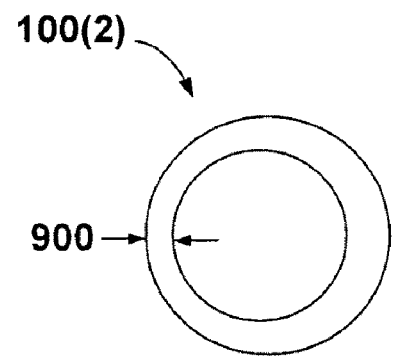
Figure 10:
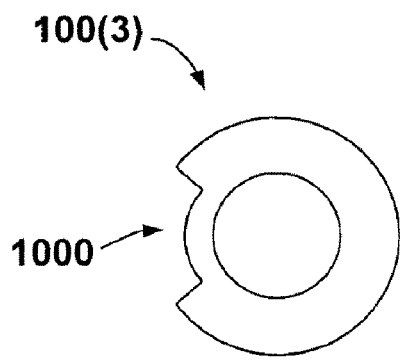
Figure 11:
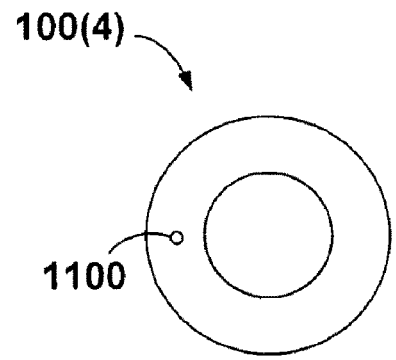

Micromagnetic elements, logic devices and methods of fabricating and using them to store data and perform logic operations are disclosed herein. The elements and devices may advantageously operate with low power requirements, are reconfigurable and have the ability to retain data during power interruptions. Further, the elements and devices can be inherently radiation hard and immune to EMP effects.

In addition to use of the micromagnetic elements in magnetic storage media and magnetic logic devices, the disclosed micromagnetic elements are, for example, usable for anti-counterfeiting purposes and in humidity and temperature sensors. In anti-counterfeiting applications, micromagnetic elements may be used to form a magnetic watermark that is only visible under polarized light and in the presence of a magnetic field. In sensors, a polymer film applied over the magnetic film may change thickness in response to the environment, thereby altering reflectance.

In the attached drawings, like numbers represent similar elements in multiple figures. Numbering without parentheses is used to denote a genus (e.g., device 1200), whereas numbering with parentheses denotes a species within a genus (e.g., device 1200(2)). These drawings may not be drawn to scale, and multiple elements may not be labeled for the sake of clarity.

FIGS. 1 and 2 show an exemplary micromagnetic element 100 that is ring-shaped; other geometries may also be used without departing from the scope hereof. In one embodiment, micromagnetic element 100 may be fabricated using lithographic and vapor deposition techniques to create a toroidal thin magnetic film 102, e.g., a Ni film, on a fused silica substrate (not shown). Magnetic film 102 may, for example, have an outer diameter between 100-1000 nm, and a thickness corresponding to the number of atomic layers deposited, e.g., one atomic layer has a thickness of about 125 pm, two atomic layers have a thickness of about 2.5 Å, etc. A practical upper value for the thickness of magnetic film 102 is, for example, about 100 nm, because this thickness of material may be applied rapidly and is sufficient to withstand abrasion.

A portion of magnetic film 102 (e.g., half) may be coated with an optical coating 202, such as a vacuum deposited dielectric or metal, or a spin coated or dip coated polymer. The other portion of magnetic film 102 may be uncoated, or coated with a material having an index of refraction that differs from coating 202. Application of optical coating 202 to a portion of element 100 creates an asymmetry that enhances (or suppresses) signal intensity during optical readout, as discussed in more detail below.

FIGS. 3-6 show exemplary magnetization states of micromagnetic element 100 of FIGS. 1 and 2. In FIG. 3, application of an external magnetic field 300 near element 100 generates a magnetically saturated state, where all unpaired electrons 302 within the material should be aligned with magnetic field 300. As shown in FIG. 4, removal of magnetic field 300 creates two symmetrical magnetic domains 402, 404 having unpaired electron configurations 406, 408, respectively, which are biased in the direction of magnetic field 300. This state, in which the magnetic field associated with one half of micromagnetic element 100 is opposed by the magnetic field of the other half, is referred to as the "onion state". Once element 100 is in the onion state, application of a external magnetic field 502 perpendicular to the direction of magnetic field 300 breaks the symmetry of the onion state and biases element 100 toward a counter clockwise (CCW) vortex state 504, or a clockwise (CW) vortex state 602, as shown in FIGS. 5 and 6, respectively. Element 100 may be used to store or process binary data. Typically, the CCW vortex state 504 may represent "0", and the CW vortex state 602 may represent "1". If magnetic field 502 is not applied to element 100, the element remains in the onion state, which represents an indeterminant value. It will be appreciated that positive (FIG. 4) and negative onion states are possible, and distinguishable from one another. These onion states, or indeterminant values, represent possible third and fourth output values, which are not used in conventional electronic logic devices.

FIG. 7 shows a hysteresis loop 700 for micromagnetic element 100 of FIGS. 1-6. For purposes of illustration, the magnetic states of micromagnetic element 100 are shown on hysteresis loop 700. The positive (FIG. 4) and negative onion states are observed at large absolute magnetization values because the unpaired electron configurations 406, 408 are aligned with (or biased toward) the direction of the applied magnetic field 300. The vortex states 504, 602, on the other hand, do not produce a large net magnetization. Vortex states 504, 602 are therefore observed near the origin of the y-axis.

FIGS. 8-11 show exemplary micromagnetic elements 100(1)-100(4) which are designed with structural defects, or alterations, that provide pinning sites to promote switching between the onion state and vortex state 504 or 602. Pinning sites, in general, are areas where the energy required to change the orientation of unpaired electrons is higher than surrounding areas. In toroidal structures, a pinning site acts as a blocking feature that prevents the domains of the onion state 402, 404 from simply shifting orientation and aligning with external magnetic field 502. Micromagnetic element 100(1) contains a notch 800 forming a narrow section 802, which should have a higher switching field than surrounding areas, and element 100(2) forms an asymmetric ring that contains a narrow section 900. Element 100(3) has a larger notch 1000 that produces properties between those observed for elements 100(1) and 100(2). Element 100(4) functions according to an alternative mechanism; it contains a hole 1100 that acts as an energy minimum around which a vortexcore boundary can form. It will be appreciated that structural defects, or alterations, other than those shown in FIGS. 8-11 may be used to promote domain wall pinning within micromagnetic element 100 without departing from the scope hereof.

FIGS. 12-15 show an exemplary micromagnetic logic device 1200(1) configured as a NOT gate. Device 1200(1) contains two micromagnetic elements 100(5), 100(6) joined by a connector 1202. Connector 1202 may, for example, be fabricated using lithography and vapor deposition techniques such as those used to produce elements 100. Elements 100 and connector 1202 form a logic circuit whereby magnetic exchange interactions occur between connected elements 100(5) and 100(6).

Figure 12:
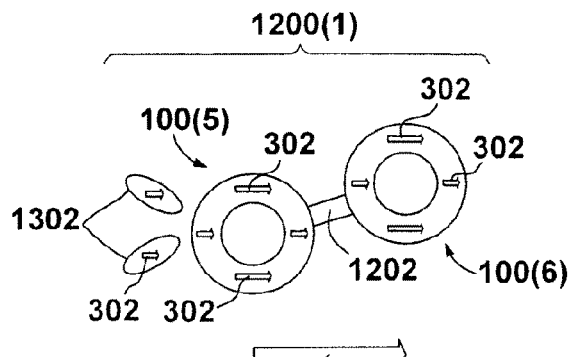
FIGS. 12-15 show an exemplary micromagnetic logic device configured as a NOT gate, according to an embodiment.
Figure 13:
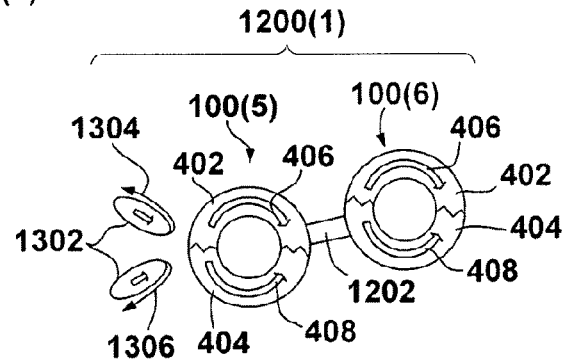
Figure 14:
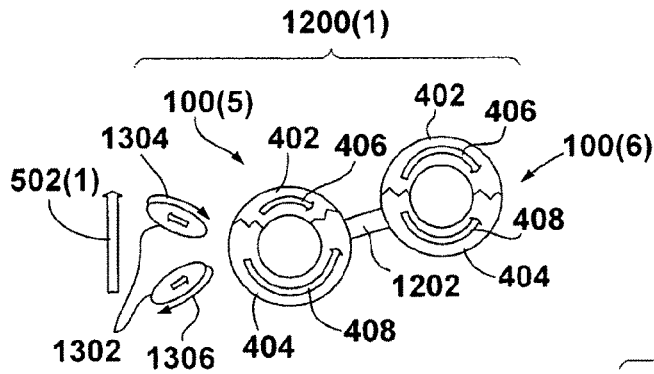
Figure 15:
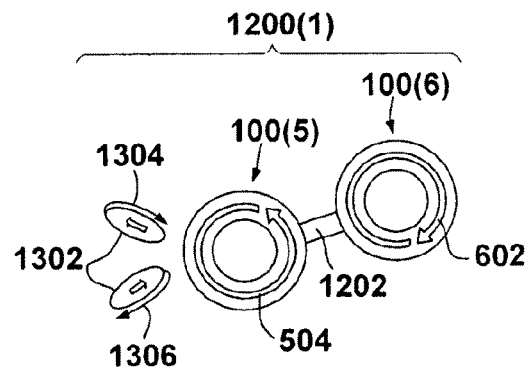

As shown in FIG. 12, an external magnetic field 300 is applied near device 1200(1) causing magnetic saturation, i.e., all unpaired electrons 302 are aligned with the applied magnetic field 300. When magnetic field 300 is removed, the unpaired electrons 406, 408 of each element 100 form an onion state having two equal magnetic domains 402, 404, as shown in FIG. 13. Although a micromagnetic element 100 in the onion state may alone be sufficiently stable, in one embodiment, a pair of ellipsoids 1302 may be positioned proximal to element 100(5). The proximity of ellipsoids 1302 to micromagnetic element 100(5) is, for example, between 2-20 nm, and each ellipsoid is oriented at forty-five degrees relative to the direction of the applied field 300 and at ninety degrees relative to the other ellipsoid. Ellipsoids 1302 may be fabricated as thin, conductive magnetic films by the same methods used to produce elements 100. Magnetic fields 1304, 1306, associated with ellipsoids 1302, may stabilize the onion state until a perpendicular magnetic field 502 is applied, either through a strip line or externally, to induce the desired vortex state 504, 602 in element 100(5). An electrically conductive, non-magnetic strip line may, for example, form part of a conductive grid that supplies an electrical current, which generates magnetic fields 300 and 502. In one embodiment, the strip line may penetrate element 100 to provide a clockwise or counterclockwise magnetic field. When perpendicular magnetic field 502 is applied, fields 1304, 1306 become demagnetizing and promote the growth of one domain 402, 404 over the other; in FIG. 14, growth of the CCW domain 404 is promoted. As shown in FIG. 15, element 100(5) assumes a CCW vortex state 504. The magnetic exchange interactions occurring via connector 1202 then make the CW vortex state 602 energetically favorable in element 100(6), and an inversion operation is achievable. It will be appreciated that, in one embodiment, connector 1202 may not be present, and elements 100(5) and 100(6) may be directly joined to one another.

Figure 16:
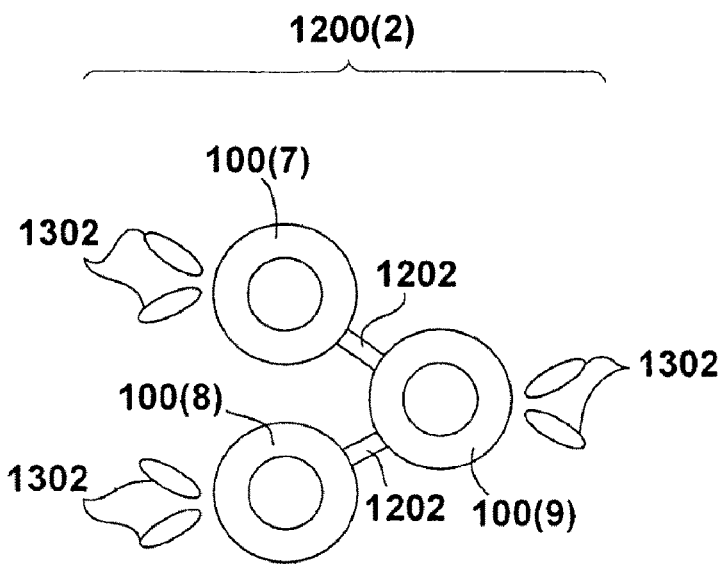
FIG. 16 shows an exemplary micromagnetic logic device for performing NOR and NAND operations, according to an embodiment.

Designs beyond the simple inverter are also possible. FIG. 16 shows a micromagnetic logic device 1200(2) including three ring-shaped elements 100(7)-100(9) having a V-shaped geometry. Connectors 1202 may be formed between elements 100(7) and 100(9) and between elements 100(8) and 100(9). Pairs of ellipsoids 1302, where each ellipsoid is preferably oriented at forty-five degrees relative to the direction of the applied field 300 (FIG. 12) and ninety degrees relative to one another, may be positioned proximal to each element 100(7)-100(9). This configuration may be used to perform NAND or NOR operations when two inputs are provided in separate steps.

The logic operation begins after all elements 100(7)-100(9) are set to the onion state. In a first step, signal pulses are applied through inputs near elements 100(7) and 100(8), or strip lines running through the cores of 100(7) and 100(8), to impose CW or CCW states on each of elements 100(7) and 100(8). Table 1 illustrates the truth table for device 1200(2), where "- - -" represents the high impedance onion state, and two steps are required to set the final value of the output. During the first step, only equal inputs (i.e., both CW or both CCW) result in a change in the state of output element 100(9). During the second step, a signal is sent to element 100(9). This signal is sufficient to convert the onion state of element 100(9) to CW or CCW as shown in Table 1, but it cannot reverse the vortex state of element 100(9) if it has been set during the first step. The overall truth table for NAND and NOR gates is shown below.

TABLE 1

| Input 100(7) | Input 100(8) | Output 1st Step | Output 2nd Step, 100(9) = 0 | Output 2nd Step, 100(9) = 1 |
|---|---|---|---|---|
| 0 | 0 | 1 | 1 | 1 |
| 1 | 0 | — | 0 | 1 |
| 0 | 1 | — | 0 | 1 |
| 1 | 1 | 0 | 0 | 0 |
|   |   |   | NOR | NAND |

Figure 17:
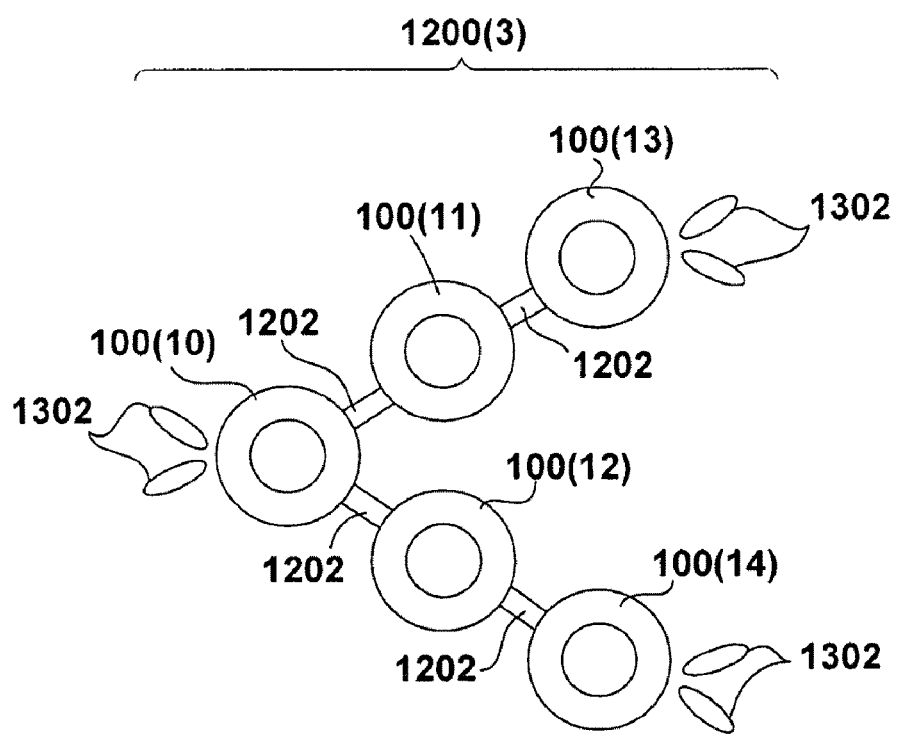
FIG. 17 shows an exemplary micromagnetic logic device for performing OR and AND operations, according to an embodiment.

FIG. 17 shows a micromagnetic logic device 1200(3) including five ring-shaped elements 100(10)-100(14) having a symmetrical, V-shaped geometry. This configuration may be used to perform AND or OR operations when two inputs are provided during separate steps. The logic operation begins after all elements 100(10)-100(14) are set to the onion state. In a first step, signal pulses are applied through inputs near 100(13) and 100(14) to impose CW or CCW states on each of these elements. The presence of intermediate elements 100(11) and 100(12) creates a double inversion of the input magnetic state, so that it appears unchanged at output element 100(10).

Table 2 illustrates the truth table for device 1200(3), where "- - -" represents the high impedance onion state, and two steps are required to set the final value of the output. During the first step, only equal inputs (i.e., both CW or both CCW) result in a change in the state of output element 100(10). During the second step, a signal is sent to element 100(10). This signal is sufficient to convert the onion state of element 100(10) to CW or CCW as shown in Table 2, but it should not be able to reverse the vortex state of element 100(10) if it has been set during the first step. The overall truth table for AND and OR gates is shown below.

TABLE 2

| Input 100(13) | Input 100(14) | Output 1st Step | Output 2nd Step, 100(10) = 0 | Output 2nd Step, 100(10) = 1 |
|---|---|---|---|---|
| 0 | 0 | 0 | 0 | 0 |
| 1 | 0 | — | 0 | 1 |
| 0 | 1 | — | 0 | 1 |
| 1 | 1 | 1 | 1 | 1 |
|   |   |   | AND | OR |

Figure 18:
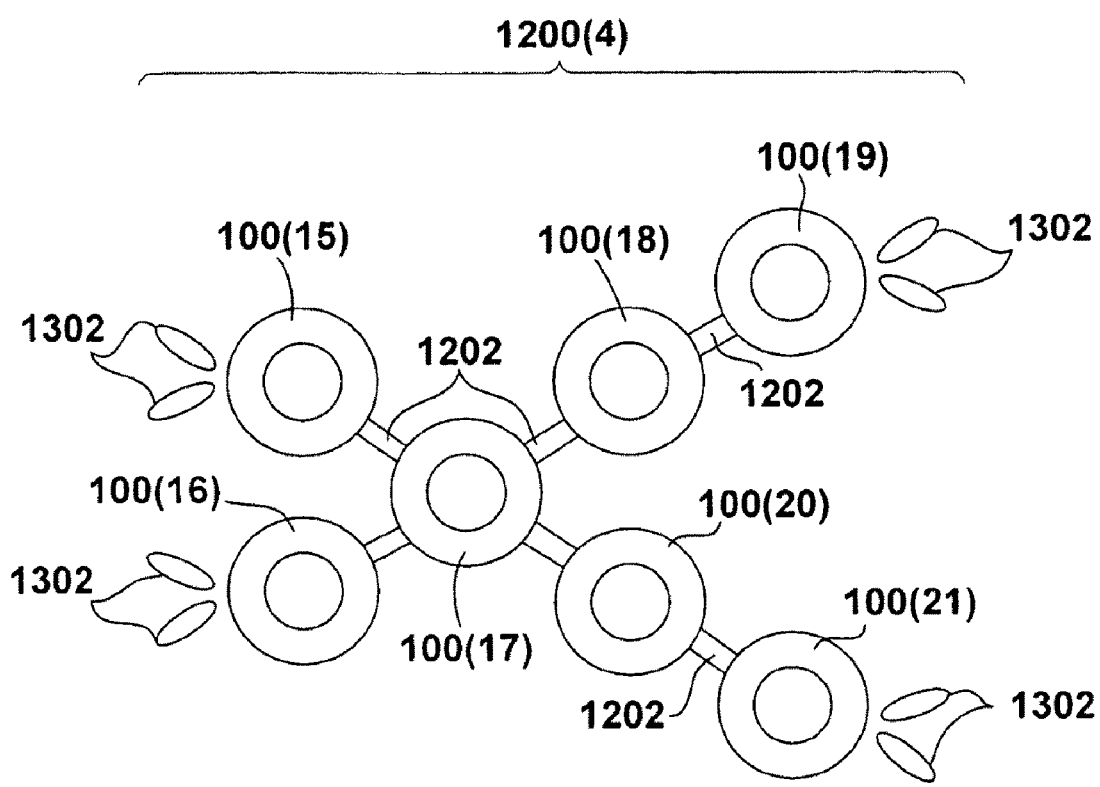
FIG. 18 shows an exemplary micromagnetic logic device for performing NOR, NAND, OR and AND operations, according to an embodiment.

FIG. 18 shows an exemplary micromagnetic logic device 1200(4) having an X-shaped configuration that may perform NAND, NOR, AND or OR functions, depending on the input sequence. The sequence begins with setting elements 100(15)-100(21) to the onion state. For NAND or NOR operations, signal pulses are applied to elements 100(15) and 100(16) to impose CW or CCW states on each of these elements. During a first step, only equal inputs (i.e., both CW or both CCW) result in a change in the state of output element 100(17). During a second step, a signal is sent to element 100(19) or 100(21). However, due to the presence of an intermediate element 100(18), 100(20), the sign of the second input will be twice inverted, and appear unchanged, at output element 100 (17). To perform AND or OR operations, elements 100(19) and 100(21) are used as the two inputs in the first step, and element 100(15) or 100(16) is used as the input in the second step to determine the logic function of device 1200(4) by setting the values for the indeterminate states. Table 3 illustrates the truth table for device 1200(4).

TABLE 3

| Input 100(15) | Input 100(16) | Output 1st Step | Output 2nd Step, 100(19) or 100(21) = 0 | Output 2nd Step, 100(19) or 100(21) = 1 |
|---|---|---|---|---|
| 0 | 0 | 1 | 1 | 1 |
| 1 | 0 | — | 0 | 1 |
| 0 | 1 | — | 0 | 1 |
| 1 | 1 | 0 | 0 | 0 |
|   |   |   | NOR | NAND |
| 100(19) | 100(21) | 1st Step | 2nd Step, 100(15) or 100(16) = 0 | 2nd Step, 100(15) or 100(16) = 1 |
| 0 | 0 | 0 | 0 | 0 |
| 1 | 0 | — | 1 | 0 |
| 0 | 1 | — | 1 | 0 |
| 1 | 1 | 1 | 1 | 1 |
|   |   |   | OR | AND |

It should be noted that the number of micromagnetic elements 100 and the geometrical arrangements of those elements may vary from what is shown in the figures and described in the text. Logic devices 1200(1)-1200(4) demonstrate several, non-limiting configurations and basic operations. Other arrangements are possible.

Figure 19:
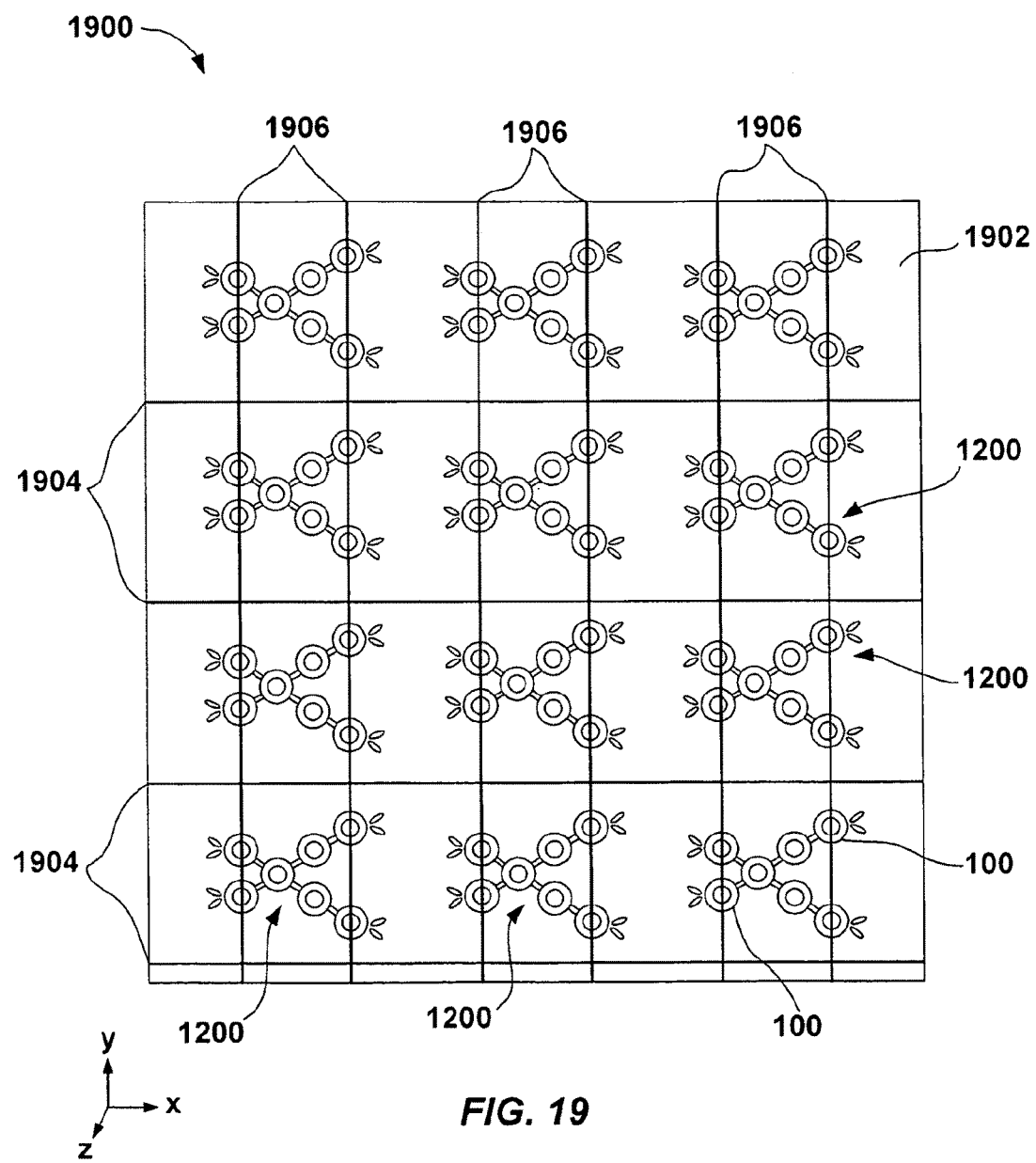
FIG. 19 shows an exemplary two-dimensional array of micromagnetic logic devices, according to an embodiment.

In one embodiment, a two-dimensional array of micromagnetic logic devices 1200 may be formed on a substrate. Such a plurality of logic devices 1200 may advantageously provide increased processing capacity and/or data storage. FIG. 19 shows an exemplary two-dimensional array 1900 of micromagnetic logic devices 1200 formed on a substrate 1902. In the example shown, logic devices 1200 have the configuration and functionality of logic device 1200(4) of FIG. 18. Electrically conductive, non-magnetic strip lines 1904, 1906 preferably form a grid on substrate 1902. As shown in this example, strip lines 1904 are oriented parallel to the x-axis and positioned between logic devices 1200. Strip lines 1904 provide a first magnetic field 300 for magnetically saturating elements 100 of logic devices 1200. Strip lines 1906 oriented parallel to the y-axis intersect one or more of elements 100 that receive input signals (e.g., elements 100 (15), 100(16), 100(19) and 100(21)). Strip lines 1906 produce a second magnetic field 502. In another embodiment, strip lines 1904 may intersect elements 100 and strip lines 1906 may be positioned between elements. In yet another embodiment, strip lines 1906 (or 1904) may intersect ellipsoids 1302 instead of, or in addition to, elements 100.

FIG. 20 shows an exemplary process 2000 for performing a logic operation using a micromagnetic logic device 1200. In step 2002, a first external magnetic field 300 is provided to magnetically saturate the micromagnetic elements 100 of a logic device 1200. In step 2004, the first external magnetic field 300 is reduced or removed, thereby forcing the micromagnetic elements 100 to adopt onion configurations. In step 2006, a second external magnetic field 502 is applied proximal to a micromagnetic element 100 to induce a clockwise or counter clockwise vortex state 504, 602 in a first micromagnetic element (e.g., 100(5)) and an opposite vortex state in a second micromagnetic element (e.g., 100(6)). The second external magnetic field 502 is applied perpendicular to the direction of the first external magnetic field 300.

Figure 21:
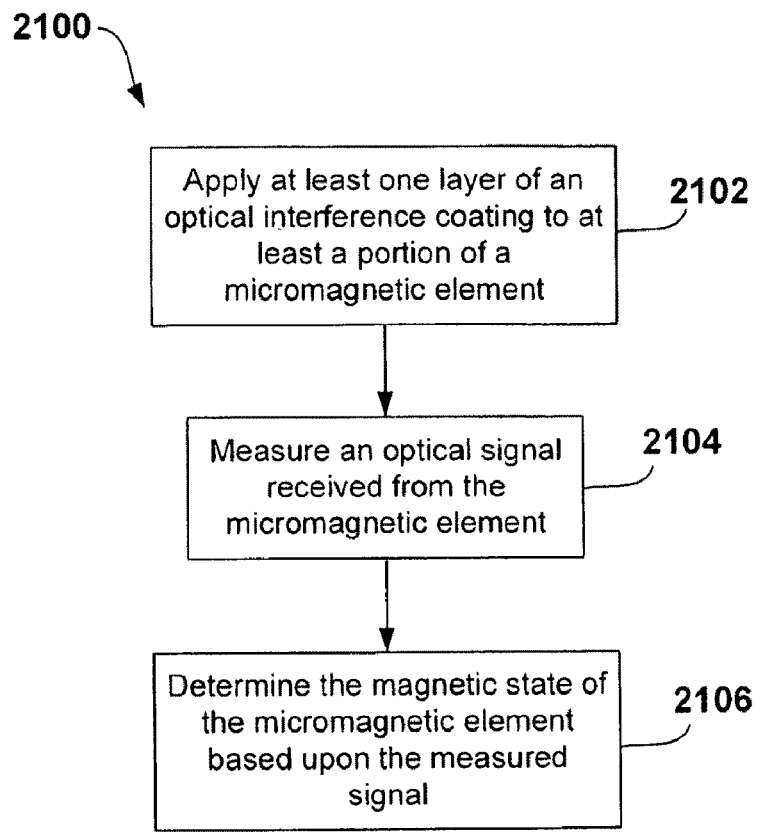
FIG. 21 shows an exemplary process for detecting a magnetic state of a micromagnetic element, according to an embodiment.

FIG. 21 shows an exemplary process 2100 for detecting a magnetic state of a micromagnetic element 100. In step 2102, at least one layer of an optical coating 202 is applied to at least a portion of a micromagnetic element 100. In step 2104, an optical signal received from the micromagnetic element 100 is measured. In an example of step 2104, a longitudinal or transverse Magneto-Optic Kerr Effect (MOKE) signal is detected by a photoelastic modulator and quantified for example by a photodiode, charge coupled device (CCD), photomultiplier tube or complimentary metal oxide semiconductor (CMOS). In step 2106, the magnetic state of the micromagnetic element 100 is determined based upon the measured signal. In an example of step 2106, the measured signal is digitized and sent to a computer that processes the signal using software stored in a memory of the computer to determine the magnetic state of the micromagnetic element 100.

It will be appreciated that optical readout (i.e., detection of the magnetic state) does not require physical contact between logic device 1200 and a detector. However, magnetoresistive techniques, using electrical contacts, can be used to determine the magnetic state of a micromagnetic element. Such techniques may permit fast and accurate readout of the magnetic state of multiple logic devices formed on a substrate.

In one example of optical readout from a micromagnetic logic device 1200, only the output element 100 is coated with an optical coating 202. In another embodiment, a coating 202 may be used to suppress substrate reflections and/or obscure parts of logic device 1200 from which signals will not be obtained. Thus, in accordance with the disclosed instrumentalities, an optical coating may be used to either enhance or suppress the optical signal deriving from the magnetization of micromagnetic element 100. Signal to noise contrast enhancement by a factor of twenty-five has been demonstrated with coatings 202 described herein. The coatings 202 detailed above are such that the ability of logic device 1200 to operate with either magnetic or electrical drive circuits is not affected.

When the magnetization of micromagnetic element 100 is in the x-y plane (best seen in FIG. 1), the use of measurement techniques that seek to detect changes along the x- and/or y-axes can be prevented, as there is no net magnetization component in the x-y plane. Instead, micromagnetic elements 100, which should be at least partially covered by an optical coating, facilitate readout by creating an asymmetry in a detected optical signal from the two portions (e.g., coated and uncoated portions) of a magnetically aligned structure, or by selectively suppressing the signal from control bits.

In one embodiment, optical coating 202 may be applied to magnetic film 102 with a gradient thickness. Differences in coating thickness between one portion of element 100 and another portion of the same element 100 create asymmetry in a detected optical signal.

A computational model has been developed to allow prediction of the effects of coatings 202. The computational model, expressed in code, functions by modeling the effect of dielectric coatings in enhancing the signal-to-noise ratio of optical reflectance signals derived from the magnetic behavior of materials. The following non-limiting examples provide details of the computational model and comparisons with experimental results.

EXAMPLE 1

Computational Model

A multilayer matrix method was implemented in MATLAB® (The MathWorks, Inc., Natick, Mass.) to determine coating reflectivities, and these values were used in a model that predicts the measured contrast in the coatings. The signal contrast or Kerr contrast, $\Delta I/I_{avg}$, was used as a figure of merit following the analysis of Allwood, D. A. et al., *Magneto-optical Kerr effect analysis of magnetic nanostructures*. Journal of Physics D-Applied Physics, 2003, 36(18): 2175-2182, where $\Delta I$ is the modulation intensity induced by magnetic field reversal, and $I_{avg}$ is the dc magnitude of the signal. The use of a single layer antireflection coating on Ni was examined, both experimentally and numerically, as well as a material-dielectric structure over opaque Ni coatings.

In-plane magnetization effects, and in particular, the longitudinal Kerr effect were modeled. At oblique incidence angles, with either s- or p-linearly polarized light, the off-diagonal elements of the dielectric tensor gave rise to a reflectance component whose polarization was rotated by 90 degrees with respect to the incident light polarization. The magnitude of the signal depended on the input intensity, the incidence angle, the magnetization, the size of the off-diagonal tensor elements, and the impedance match between the incident and exit media and the magneto-optic coating. From the known dielectric properties of the relevant materials, the coefficients for the rotated and unrotated (Fresnel) reflectance components were determined using the matrix method, as formulated by Abdulhalim, I., *Analytic propagation matrix method for linear optics of arbitrary biaxial layered media*. Journal of Optics a-Pure and Applied Optics, 1999, 1(5): 646-653 and Abdulhalim, I., *Analytic propagation matrix method for anisotropic magneto-optic layered media*. Journal of Optics a-Pure and Applied Optics, 2000, 2(6): 557-564. These coefficients were then used in a direct determination of the magnetic field-induced signal in the experimental apparatus.

Figure 22:
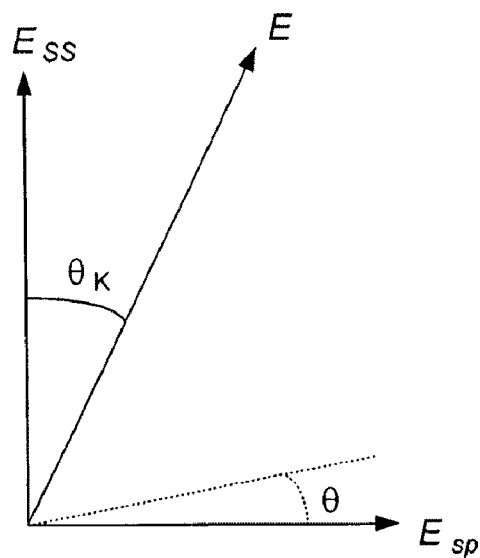
FIG. 22 shows several exemplary MOKE parameters including field amplitudes after reflection, Kerr angle and analyzer angle.

The magnetization-induced signal was measured as an intensity variation, or asymmetry, during magnetization reversal in the samples. A vector diagram of the emerging field components is shown in FIG. 22, where $E_{SS}$ and $E_{sp}$ represent energy vector for s-polarized and p-polarized light respectively; E represents an energy vector for light reflected from the sample; $\theta_K$ is the Kerr angle; and $\theta$ is the angle at which transmission is measured by a polarizing analyzer. The experimental conditions were modeled, in which phase differences between the reflected s- and p-polarized components were eliminated by a quarterwave plate, and the signal was examined for the case of s-polarized incident light. In addition to the unrotated component $r_{ss}$, there is an orthogonal Kerr component, $r_{sp}$, in the light reflected from the sample. (As used herein, lower case (e.g., $r_{ss}$) is the amplitude reflection coefficient and uppercase (e.g., $R_{ss}$) is the intensity reflectance. The first subscript represents the input polarization, and the second, the reflected polarization.) When $r_{ss}$ and $r_{sp}$ are in-phase, the reflected polarization will be rotated by the Kerr angle $\theta_K$ compared to the incident polarization (FIG. 22). For opposite magnetization directions, the sign of $r_{sp}$ will change, providing a rotation in the reflected polarization vector for opposite magnetization of $2\theta_K$.

Experimentally, a polarizing analyzer with a transmission axis making an angle $\phi$ to $r_{sp}$ was used in order to block most of the reflected s-polarized light (FIG. 22). For $\phi=0°$, the transmitted intensity of the Kerr component $R_{sp}$ is a maximum but the signal change for opposite magnetization directions will be zero. Rotating the analyzer to a small non-zero angle breaks the symmetry of the system, and the difference in the cross-term between $r_{ss}$ and $\pm R_{sp}$ becomes measurable. Following the development by Allwood et al. (2003), an expression was derived for the signal change during field reversal; this allowed a determination of the optimal choice of $\phi$ for measuring the contrast.

When the magnetic field is applied in the positive direction ($r_{sp}$ vector points in the positive direction), the intensity of the light transmitted through the polarizer is given by:

$$I^+ = (r_{ss}\sin(\phi) + r_{sp}\cos(\phi))^2 = r_{ss}^2\sin^2(\phi) + 2r_{ss}r_{sp}\sin(\phi)\cos(\phi) + r_{sp}^2\cos^2(\phi) \quad (1)$$

for $r_{sp}$ in the negative direction (opposite magnetization):

$$I^- = (r_{ss}\sin(\phi) + r_{sp}\cos(180-\phi))^2 = (r_{ss}\sin(\phi) - r_{sp}\cos(\phi))^2 = r_{ss}^2\sin^2(\phi) - 2r_{ss}r_{sp}\sin(\phi)\cos(\phi) + r_{sp}^2\cos^2(\phi) \quad (2)$$

The average transmitted intensity for light coming from the sample is:

$$I_{avg} = \frac{1}{2}(I^+_{sample} + I^-_{sample}) = r_{sp}^2\cos^2(\phi) + r_{ss}^2\sin^2(\phi) \quad (3)$$

And the difference is:

$$\Delta I = 4 r_{sp} r_{ss} \cos(\phi)\sin(\phi) \quad (4)$$

The signal of interest—the contrast induced by the magnetization—is then:

$$\frac{\Delta I}{I_{avg}} = \frac{4 r_{sp} r_{ss} \cos(\phi)\sin(\phi)}{r_{sp}^2\cos^2(\phi) + r_{ss}^2\sin^2(\phi)} \quad (5)$$

For an experimental system, there may be some depolarization of the incident light due to leakage and the non-planar wavefront arising from the condensing lens. Such depolarization appears as a small term, $\gamma$, in the denominator of Eq. (5). Note that for a small-spot system, $R_{sp}$ is typically smaller than $\gamma$ by one or two orders of magnitude:

$$\frac{\Delta I}{I_{avg}} = \frac{4 r_{sp} r_{ss} \cos(\phi)\sin(\phi)}{r_{sp}^2\cos^2(\phi) + r_{ss}^2\sin^2(\phi) + \gamma} = \frac{4 r_{sp} r_{ss} \cos(\phi)\sin(\phi)}{R_{sp}\cos^2(\phi) + R_{ss}\sin^2(\phi) + \gamma} \quad (6)$$

Equation (6), and the analogous one for p-polarized light, can be used, together with the reflectance coefficients determined using Abdulhalim's matrix formulation (1999 and 2000), to model the response of thin film stacks containing magneto-optic materials, and compare these with measurements of $\Delta I/I_{avg}$. Signal degradation terms (such as noise) are not accounted for in the calculation, other than the depolarization intensity, and a plot of the absolute value of $\Delta I/I_{avg}$ is made.

Predictions made by Abdulhalim's formulation (1999 and 2000) rely on knowledge of all terms of the dielectric tensor of each material in the multilayer stack. A dielectric tensor is a 3×3 matrix that contains information about how an electromagnetic wave will propagate in a given material. The components of a dielectric tensor are in general non-equal and complex, and can be expressed as:

$$\in_{ij} = \in_{ij}' + i\in_{ij}'' \quad (7)$$

where i, j=x, y, z. An isotropic material will have a dielectric tensor in which the diagonal terms $\in_{xx}, \in_{yy}, \in_{zz}$ are all equal and non-zero, and are referred to as the dielectric constant, $\in$. The dielectric constant, $\in$, of an isotropic material is related to the index of refraction, n, of that same material by the expression:

$$\in = n^2 \quad (8)$$

where the index of refraction can be real or complex. For a magneto-optic material, there will be additional terms in the 3×3 matrix that are non-zero. The Kerr geometry (polar, longitudinal, or transverse) determines which of these off-diagonal terms will be non-zero.

Abdulhalim's general algorithm makes two primary assumptions that apply to every material in the multilayer stack. The first is that none of the materials contain sources of energy. The second is that the materials are all homogeneous in the x-y plane. These two assumptions mean that the electric and magnetic fields in these materials can be expressed as:

$$\vec{E}(r,t) = \vec{E}(z)\exp(i(\vec{k}\cdot\vec{r}-\omega t))$$

$$\vec{H}(r,t) = \vec{H}(z)\exp(i(\vec{k}\cdot\vec{r}-\omega t)) \quad (9)$$

where $$\vec{k} = k_x\hat{x} + k_y\hat{y} + k_z\hat{z} \quad (10)$$

is the propagation vector. However, Abdulhalim reformulated this propagation vector to contain what can best be described as a unit direction vector, $\vec{v}$. Using the indices of the unit direction vector, $\vec{v} = (v_x, v_y, v_z)$, the propagation vector can be rewritten as $\vec{k} = k_0(v_x, v_y, v_z)$, where $k_0 = 2\pi/\lambda_0$. The x- and y-components of the unit direction vector can be easily calculated:

$$v_x = n_{inc}\sin\gamma\cos\phi$$

$$v_y = n_{ins}\sin\gamma\cos\phi \quad (11)$$

where $\gamma$ is the angle that the incident light makes with respect to the z-axis, $\phi$ is the angle that the light makes with the x-axis, and $n_{inc}$ is the index of refraction of the incident medium. For simplicity, it is assumed that the plane of incidence is the xz-plane so that $\phi=0$, which means that $v_y=0$. Calculation of the z-component of the unit direction vector can vary depending on whether the material involved is a general biaxial material or a material that leads to eigenmode degeneration, such as an isotropic material. Abdulhalim clearly explains the calculation of the z-component for both of these cases.

EXAMPLE 2

Antireflection Coatings

In order to optimize the Kerr signal, it is desirable to couple most of the input light into the magnetic material. Such optimization can be accomplished by overcoating with a dielectric material. A brief introduction to one method of coating design from Macleod, H. A., *Thin Film Optical Filters*. 3rd ed. 2001: Taylor and Francis is presented. An antireflection coating can be thought of as an admittance transformer, matching the admittance of the substrate material to that of the incident medium. It is common in optics to work with admittance in free space units, where (for normal incidence) the characteristic admittances of materials become equal to their complex refractive indices. In determining the optical response of a coated material, it is useful to create a graph of the evolving admittance with coating thickness, known as an admittance locus. For a dielectric film, this admittance locus gives a circle centered on a real axis, intersecting it at two points, $a_L$ and $a_H$ with $a_L \cdot a_H = n^2$, where n is the index of the layer (normal incidence). For perfect antireflection, the admittance locus must end at the admittance of the incident medium, i.e., (1, 0) for air.

Figure 23:
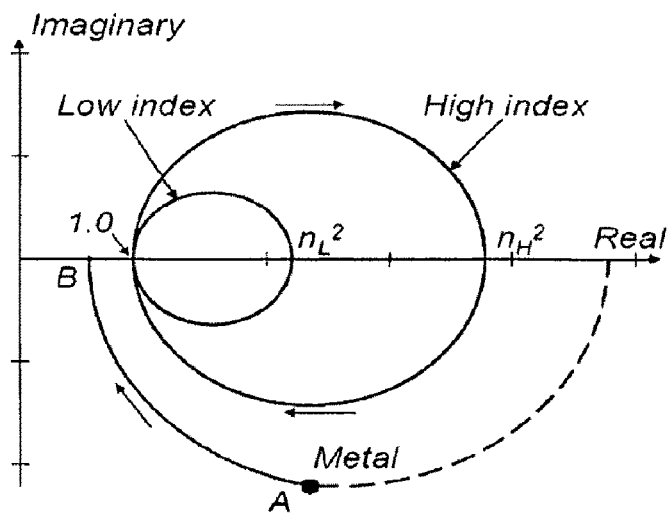
FIG. 23 shows exemplary admittance circles for high- and low-index materials.

Given a continuous range of film indices between $n_H$ and $n_L$, as shown in FIG. 23, it is possible to antireflect perfectly, for a single wavelength, any material with a characteristic admittance in the region bounded by the two circles. Should a material lie outside this region, as is the case with nickel, the best that can generally be done with a single layer is illustrated by the locus AB for the highest index available. For a perfect antireflection coating, using dielectric materials, the AB locus must be joined to one of the loci in the shaded area, most conveniently that of the high-index material. Provided that the point B has an admittance greater than $n_L^2/n_H^2$ joining the AB locus to one of the loci in the shaded area will be possible with the addition of a low-index layer to yield a three-layer antireflection coating.

Figure 24:
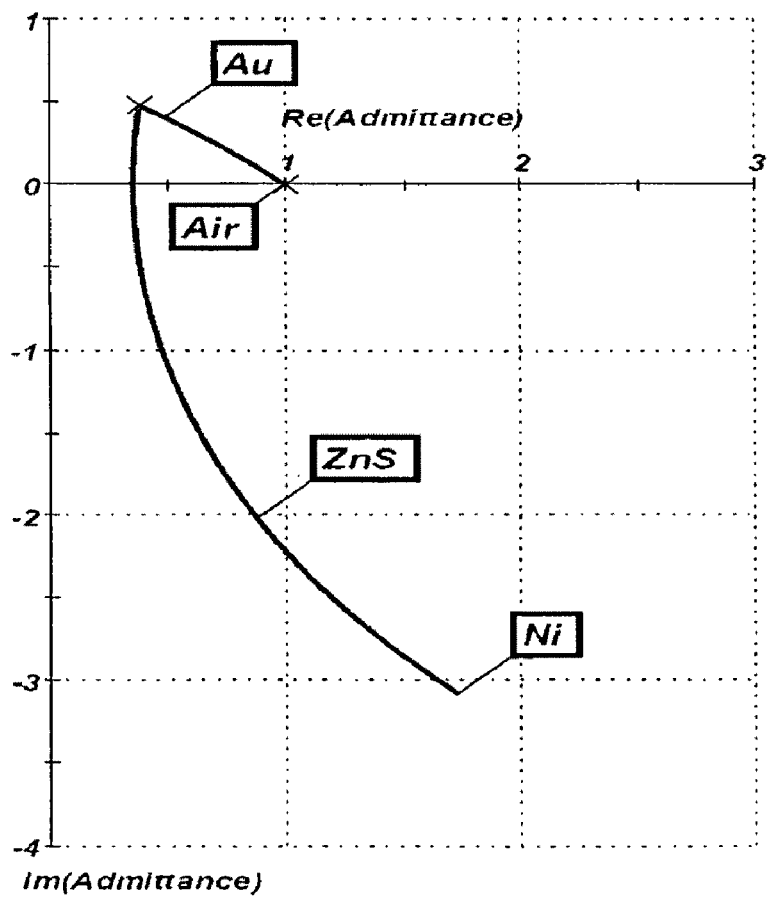
FIG. 24 shows a p-polarized admittance locus of a metal-dielectric antireflection coating optimized for 45°.

An alternative embodiment makes use of a metallic layer to bridge the gap between the locus AB and the point 1.0 on the real axis. This embodiment has the advantage of simplicity but the disadvantage of some absorption in the metal layer. FIG. 24 shows the admittance locus for such an antireflection coating for p-polarization of 45°. Note that, in this example, the admittances have been further normalized so that the air incident medium remains at the point unity at non-normal incidence. These design concepts apply rigorously to Fresnel reflection coefficients, but not as directly to the Kerr components. The design concepts can be used to minimize the substrate reflectance from the area surrounding a micromagnetic element, and to provide an approximation of the conditions necessary for optimization of the Kerr reflectance, $R_{sp}$. Maximizing the transmission into the material increases the amount of light that can be rotated, but does not necessarily maximize the transmission of the rotated component as it exits the film in the direction of the detector. The situation gets more complicated when considering non-normal incidence angles. A numerical approach is therefore used to better refine the designs and determine the optimum coating parameters.

EXAMPLE 3

Sample Preparation and Magnetic Measurements

Thin film samples were fabricated by vapor deposition onto fused silica substrates. The samples were of bare Ni and $ZrO_2$ coated Ni. The thickness of the dielectric was graded across the sample, from 150-400 nm. The $ZrO_2$ layer was patterned photolithographically to permit an accurate determination of the physical thickness at each measured point. The $ZrO_2$ was coated onto 42.5 nm of nickel, and a corner of the sample was masked to leave bare Ni for measurements.

Fused silica substrates were first washed with a solution of distilled (DI) water and Alconox® detergent. After rinsing in flowing DI water, they were ultrasonically cleaned in isopropanol in a Teflon® substrate holder. The substrates were removed from the isopropanol and immediately blown dry with filtered nitrogen gas.

The nickel (99.9% pure) was then c-beam evaporated at a rate of 4-6 Å/sec in a diffusion-pumped vacuum chamber. Base pressure in the chamber at the beginning of deposition was $3\times10^{-6}$ Torr, and the maximum pressure reached during the nickel deposition was approximately $1\times10^{-5}$ Torr. The $ZrO_2$ was deposited by reactive electron beam deposition of Zr in a background of $1\times10^{-4}$ Torr of $O_2$. Thicknesses were monitored using a quartz crystal monitor, and verified by a Tencor Alphastep® profilometer measurement. The gradient in thickness for the $ZrO_2$ was made by partially blocking the substrate with an aluminum plate placed 5 cm from the substrate. The finite size of the source led to a gradient in the coating thickness over a lateral distance of 7 mm.

Measurements were made using a NanoMOKE II® magnetometer, produced by Durham Magneto Optics, Ltd. The longitudinal MOKE configuration was used, with an applied field of +/−150 Oe. A laser diode of the magnetometer has a wavelength of 635 nm and was incident upon the sample at an angle of about 45 degrees. Linearly polarized light was incident on the sample with either the p- or s-polarization, and the reflected signal was measured. A quarterwave plate was adjusted to restore linear polarization after reflection off the sample. Since the magnetically rotated reflectance component was so small, a cross-term with the unrotated light was measured by moving the analyzer slightly off the excitation angle.

Figure 25:
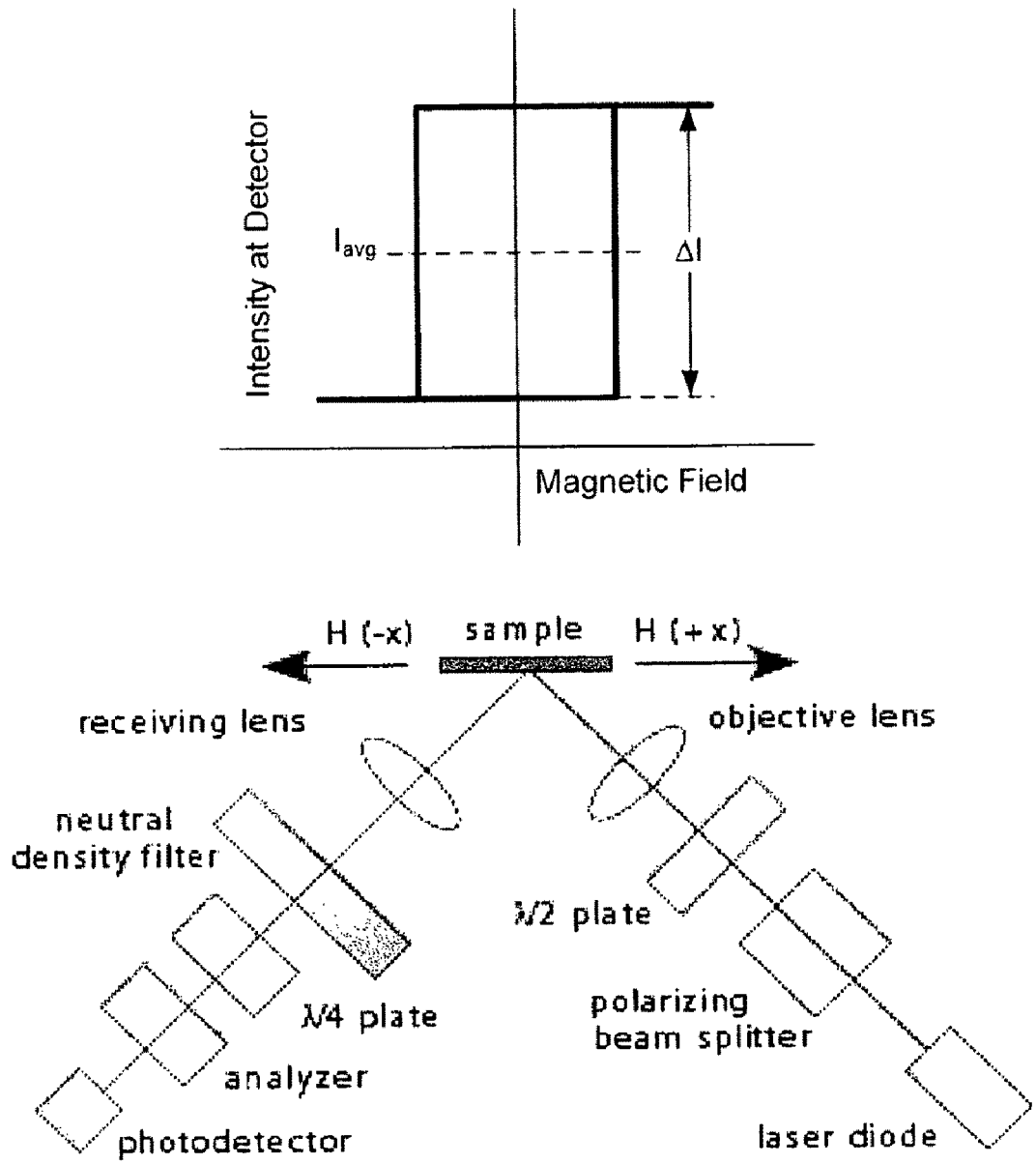
FIG. 25 shows a schematic of an experimental apparatus and measured signal.

Components of the measurement system are shown in FIG. 25. In addition to the standard components, a variable neutral density filter was inserted into the beam path between the receiving lens and quarter waveplate to allow measurement to be made at large analyzer angles without saturation of the photodetector. A zero-order half waveplate centered at 632.8 nm was placed between the polarizing cube and the objective lens in order to select for p-polarized or s-polarized light; this plate was tilted a few degrees to provide optimal rotation of the 635 nm wavelength input light. The tilt was adjusted by minimizing the null signal at the detector with the analyzer at the extinction angle.

A schematic hysteresis loop is shown at the top of FIG. 25. An applied field is plotted along the x-axis, and the intensity incident at the photodetector is plotted along the y-axis. The two metrics of particular interest for this experiment are $\Delta I$, the height of the loop, and $I_{avg}$, the intensity at the vertical center of the loop. The Kerr contrast is defined as $\Delta I/I_{avg}$, and is the metric that was maximized, as it is the manifestation of the magnetic response of the material.

Measurements of $\Delta I/I_{avg}$ for all samples were made by first minimizing (nulling) the signal at each thickness by iteratively rotating the quarter waveplate and analyzer. The nulled analyzer position defines $\phi=0°$, and the quarter waveplate rotation angle and null signal were recorded. The signal change, $\Delta I$, induced by the applied field, and average signal, $I_{avg}$, as a function of analyzer angle, $\phi$, were then measured.

The NanoMOKE II® magnetometer used for these measurements could only saturate nickel films with thicknesses up to 50 nm. For 42.5 nm thick samples, approximately 2% transmission was observed, but the difference between the Kerr component of reflectivity of an opaque film and one of 42.5 nm was less than 0.1%, based on both calculations and observations.

Optimization of the MOKE contrast for the case where the phase shift is externally adjusted requires maximization of $r_{sp}$ or $r_{ps}$ (the rotated light reflectivity) and adjustment of $r_{pp}$ or $r_{ss}$ (the Fresnel component) to the optimal level for the given experimental setup. Calculations were used to model the improvement in contrast resulting from coating the magneto-optic material, and measurements confirmed the results for a coated film of nickel.

Optical constants were taken from the literature and the values were confirmed by measurements of the s- and p-polarized reflectivities at a 45° angle of incidence. The values for the diagonal elements, $\in_{xx}=\in_{yy}=\in_{zz}$ were 4.2 for $ZrO_2$ (see Sloan, *The Sloan Notebook-Suggestions for Thin Film Deposition* (Sloan Technology Corporation, Santa Barbara, Calif.)), −9.9+1.01 i for Au (see Palik, E. D., ed. *Handbook of Optical Constants of Solids*. 1985, Academic Press: Orlando, Fla.) and −13.45+21.38 i for Ni (Palik, 1985). The components of the off-diagonal elements of the dielectric matrix were determined by measuring the magneto-optic coefficients of bare nickel films, and were in reasonable agreement with values from the literature (see Erskine, J. L. and E. A. Stern, *Magneto-Optic Kerr Effect in Ni, Co, and Fe*. Physical Review Letters, 1973, 30(26): 1329-1332 and Visnovsky, S. et al., *Magnetooptical Kerr Spectra of Nickel*. Journal of Magnetism and Magnetic Materials, 1993, 127(1-2): 135-139). The off-diagonal terms, $\in_{xy}$ for Ni were taken as 0.324-0.015 i, based on fitting the measured values of $\Delta I/I$ for s- and p-polarized measurements of the MOKE signal. It should be noted that the depolarization factor introduced by the collimating lens leads to some distortion of these values. However, for determining the enhancement obtainable with a coating, it is desirable to use these experimental values.

EXAMPLE 4

Validation and Optimization

Polar Kerr Effect—Code Validation

In order to model a wide variety of optical coatings, the method described by Abdulhalim (1999 and 2000) was implemented, using MATLAB®. The code was validated by calculating the four-layer design of Balasubramanian, K., A. S. Marathay, and H. A. Macleod, *Modeling Magneto-Optical Thin-Film Media for Optical-Data Storage*. Thin Solid Films, 1988, 164: 391-403, (previously used for validation by Mansuripur, M., *Analysis of Multilayer Thin-Film Structures Containing Magnetooptic and Anisotropic Media at Oblique-Incidence Using 2×2 Matrices*. Journal of Applied Physics, 1990, 67(10): 6466-6475 and by Abdulhalim (1999)) for magneto-optic storage layers, successfully reproducing their results.

Enhancing $r_{sp}$ Using Optical Overlayers

Examining again the expression in Eq. (6), it is clear that an increase in $r_{sp}$ will lead to an enhancement of the Kerr contrast. Such an increase in $r_{sp}$ can be accomplished by addition of an antireflection layer. A coating applied to the nickel (or other magneto-optic material) can increase the amount of light that reaches the interior of the magneto-optic layer, and hence the rotated component. As Qureshi, N., H. Schmidt and A. R. Hawkins observed, for a single layer dielectric (*Cavity enhancement of the magneto-optic Kerr effect for optical studies of magnetic nanostructures*. Applied Physics Letters, 2004, 85(3): 431-433), an optimal impedance match is achieved for n~3.7, which is a somewhat inconvenient value for an experimentalist wishing to operate in the visible region of the spectrum. However, it is possible to obtain the same impedance match through either a multilayer design, or a two layer metal-dielectric coating, as described above.

Figure 26:
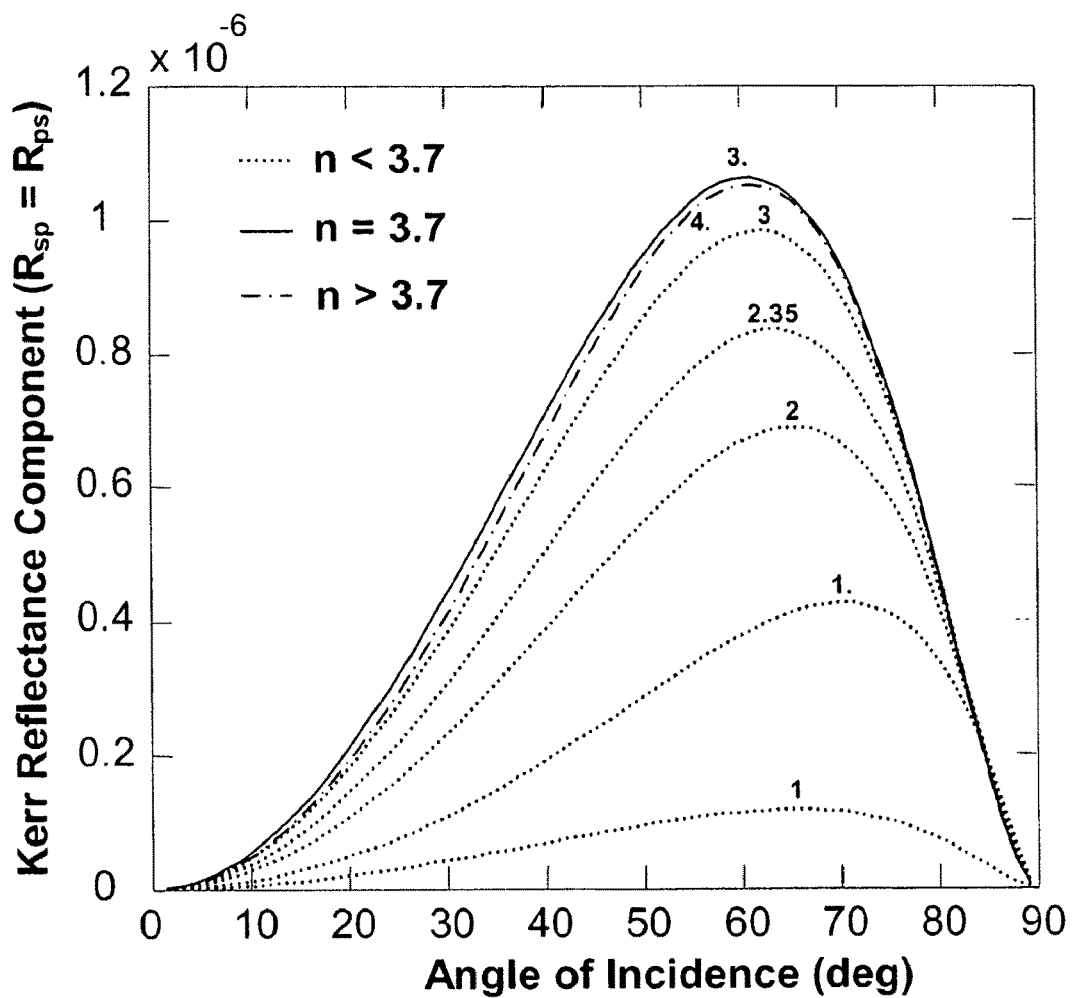
FIG. 26 shows longitudinal Kerr reflectance curves as a function of incidence angle for several dielectric overcoats on Ni.

In FIG. 26, the calculated reflected longitudinal Kerr intensity, $R_{sp}=r_{ps}^2$, is shown as a function of incidence angle and refractive index for a single layer dielectric coating on Ni. For each index value, a thickness of overcoat that maximizes the value of $R_{ps}$ is used. The value of $R_{ps}$ at $n_c=1$ represents uncoated metal. A factor of approximately 8 improvement in the rotated component of the intensity may be expected from a ZnS (n=2.35) overcoat on Ni. An additional gain in the raw longitudinal Kerr signal may be realized by adjusting the incident angle. The optimal angle also shifts slightly when the magneto-optic material is overcoated with the dielectric, as shown.

Increases in the value of $r_{ps}$ will increase the numerator in Eq. (6), but the contrast ratio of the system is a function of $r_{ps}$ and $r_{pp}$, which are interdependent quantities.

Optimum Ratio of $r_{sp}$ to $r_{ss}$ or $r_{pp}$

Although $r_{sp}$ and $r_{ss}$ are almost inversely related, a small reduction in $r_{sp}$ from the maximum value allows tuning of $r_{ss}$ through a substantial range to find the optimal conditions for magnetic contrast. From Eq. (6), the maximum contrast is obtained by optimizing $\Delta I/I_{avg}$. Since $r_{sp}$ is many orders of magnitude smaller than $r_{ss}$ for (small) values of $\phi$ that lead to non-zero numerators, the dominant term in the denominator is $R_{ss}$ or $\gamma$.

When an antireflection coating is applied to increase the value of $r_{sp}$, a simultaneous reduction in $r_{ss}$ (and $r_{pp}$) is generally observed. Although this gives a larger value for the Kerr rotation angle, it also leads to a reduction in the magnitude of the cross-term that is measured. Analyzer angles are typically on the order of $10^{-2}$ radians, and γ is typically on the order of $10^{-4}$, so reduction of $r_{ss}$ below a few percent no longer enhances the contrast. In fact, reduction of $r_{ss}$ reduces ΔI while $I_{avg}$ stays constant (γ dominates), reducing the overall contrast. This signal loss can be regained under some conditions by measurement at a larger analyzer angle, ϕ. In the calculations below, Abdulhalim's formulation is again used to derive the reflection coefficients and Allwood's treatment of the signal in the presence of a depolarization term is used to predict the signal contrast ratio for a dielectric coated magneto-optic film for both s- and p-polarized light incident at 45 degrees. Phase effects are not considered in these calculations, as these experimental conditions permit adjustment of the phase to generally obtain only linearly polarized light.

ZnO$_2$ on Ni

The effect of a dielectric overcoat on a magneto-optic material was modeled to determine the relationship between $r_{sp}$, $r_{ss}$, the Kerr angle and the angle-independent term in the expression for ΔI.

Figure 27:
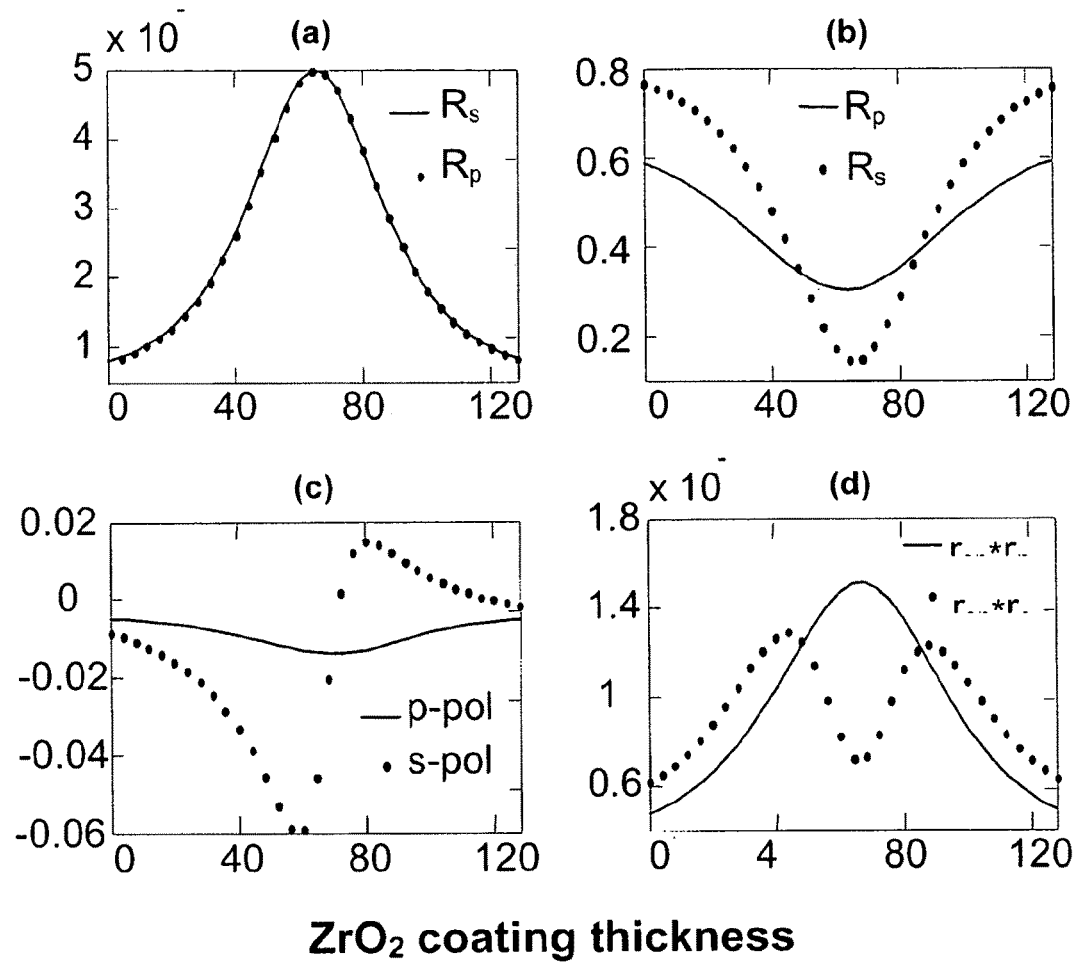
FIG. 27 shows reflectance components and Kerr angle for $ZrO_2$ coated Ni as a function of dielectric thickness.
Figure 28:
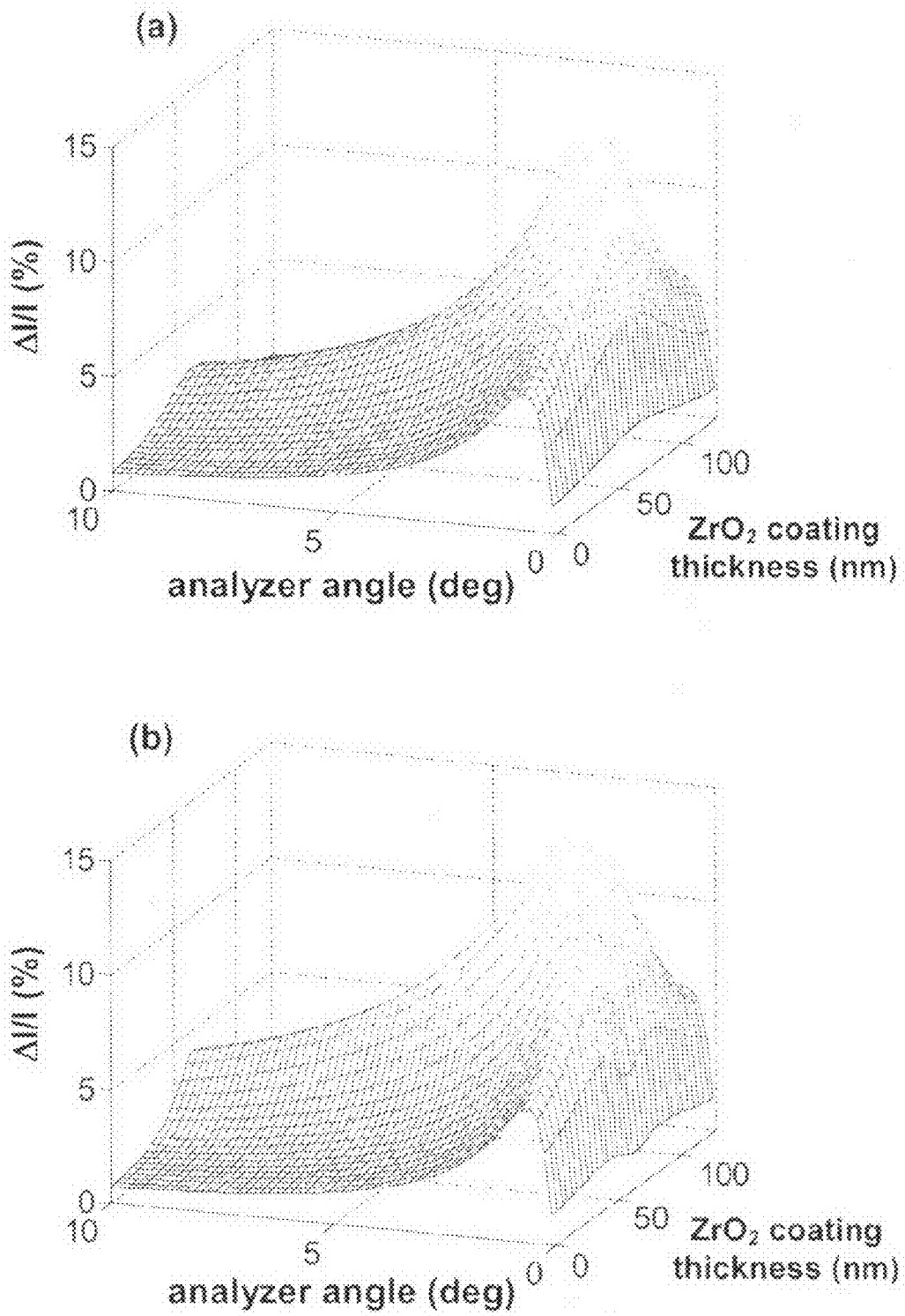
FIG. 28 shows modeled Kerr contrast curves as a function of analyzer angle and $ZrO_2$ thickness for s- and p-polarized light incident at 45°.

FIGS. 27 and 28 present the results for 42.5 nm of Ni deposited on fused silica, and overcoated with a gradient thickness of ZrO$_2$. FIG. 27 has four panels: (a) presents the magnitude of R$_{sp}$; (b) presents the magnitude of the unrotated reflectances; (c) presents the value of the Kerr angle in radians; and (d) presents the amplitude ($4r_{ss}r_{sp}$, $4r_{ps}r_{pp}$) of ΔI in Eq. (6) for the two polarizations. All results are plotted as a function of the thickness of the dielectric coating. Note that, while the Kerr angle is greatly enhanced, and changes sign around the minimum reflectivity for s-polarization, the ΔI amplitude term is actually larger for the p-polarization around this film thickness (42.5 nm). To explore the contrast, the magnitude of ΔI/$I_{avg}$ as a function of both film thickness and analyzer angle was plotted. The results are shown in FIG. 28 for both p- and s-polarizations as plots (a) and (b) respectively. The vertical axis of both plots is the contrast ratio ΔI/$I_{avg}$ and the horizontal axes are the film thickness and the analyzer angle, ϕ. Note that for s-polarization, the peak of the plot is slightly broader, and there is a double peak for low analyzer angles near 65 nm thickness.

For both p-polarized and s-polarized light, the coating increases the ΔI/$I_{avg}$ ratio and moves the optimum analyzer angle to larger values. The larger analyzer angle is helpful to recoup losses in the magnitude of the cross-term due to the reduction in R$_{ss}$ and R$_{pp}$. This increased magnitude at larger analyzer angles is more marked for s-polarized light than for p-polarized light, due to larger reductions in R$_{ss}$.

Metal-Dielectric Coating—Au/ZrO$_2$/Ni

To improve the impedance matching using some available dielectrics, a two layer design including a thin metal layer atop the dielectric can be used. For this example, 16 nm of gold (based on an optimization of the contrast) was deposited onto a variable thickness ZrO$_2$ coating on a 42.5 nm thick Ni film.

Figure 29:
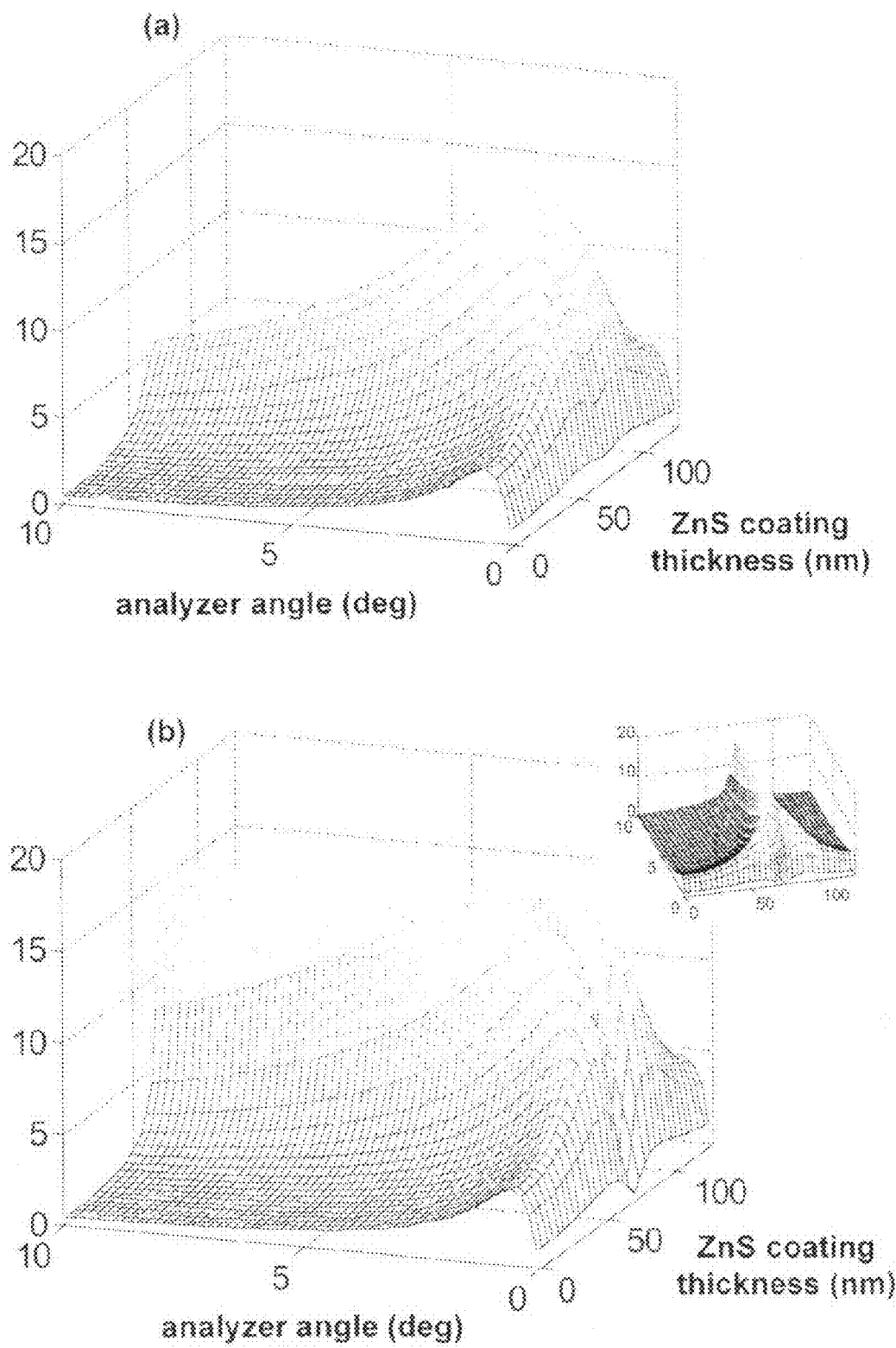
FIG. 29 shows modeled Kerr contrast curves for a 13 nm Au film on $ZrO_2$, as a function of analyzer angle and $ZrO_2$ thickness for s- and p-polarized light incident at 45°.

FIG. 29 shows the results for p- and s-polarization as plots (a) and (b) respectively. Two different viewing angles are shown for the s-polarization, which has a deep cleft in the signal at low analyzer angles. This cleft coincides with the change in the sign of the Kerr angle, and at high resolution, contains a hard zero in the contrast. Note that the peak contrast values are approximately the same for the two polarizations, but that larger analyzer angles must be used to attain the peak for s-polarization. The maximum contrast in the model is improved by about 5% over the single layer ZrO$_2$ coating using the optimized two-layer design. For a metal/dielectric overcoat with a slightly thinner gold film (13.2 nm), the maximum s-polarization Kerr angle enhancement (over bare Ni) can be increased by a factor of 200, while for p-polarization Kerr angle enhancement is only a factor of 10. These results do not correlate with the measurable contrast (ΔI/$I_{avg}$) improvement, which can be a factor of roughly 2.5 for each polarization. This lack if correlation emphasizes the need for a systems approach when attempting to improve the signal-to-noise or contrast ratio.

EXAMPLE 5

Experimental Results

Bare Ni Film

Figure 30:
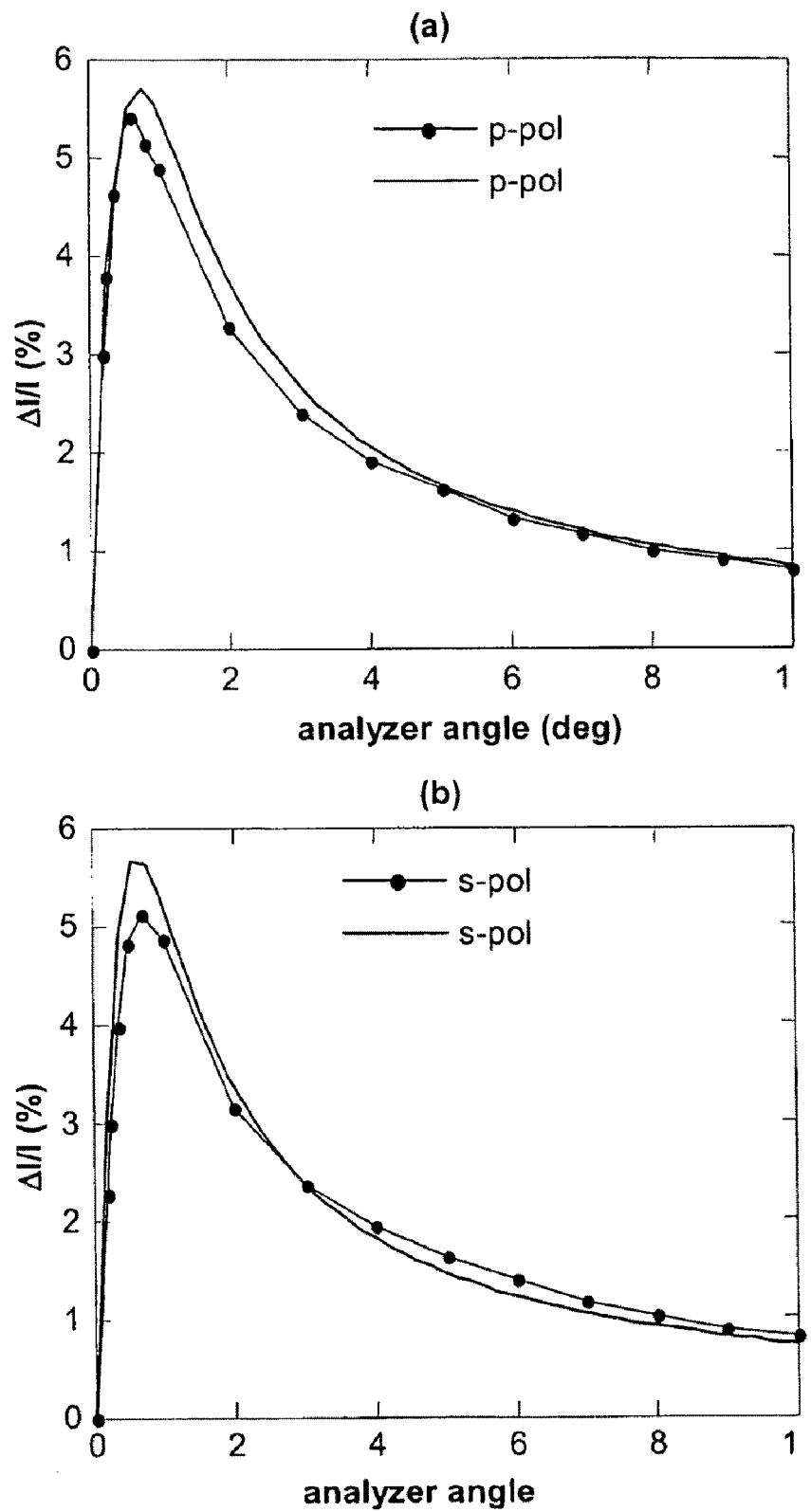
FIG. 30 shows modeled and experimental Kerr contrast curves for a 42.5 nm thick Ni film for s- and p-polarized light incident at 45°.

Results for measurement and modeling of ΔI/$I_{avg}$ for an uncoated region of the 42.5 nm thick Ni film are shown in FIG. 30. Calculations used a value of γ=1×10$^{-4}$. Experimentally, experienced depolarization and low throughput of the system imply larger uncertainties at small analyzer angles. The minimum detector voltage value, $I_{avg}$, for p-polarized light, measured at the null point, was 50 mV. At the peak, ΔI/$I_{avg}$ was 100 mV, and at angles about 3 degrees, it was maintained at 2000 mV by adjusting the neutral density filter. Angles below 1 degree were difficult to measure accurately, so they were instead derived from the theoretical asymptotic form of $I_{avg}$, which decreases as sin$^2$ϕ. For the s-polarized curve, the null value was 62 mV (due to imperfections in the halfwave plate). The value of $I_{avg}$ at the peak contrast was 122 mV, and above 3 degrees $I_{avg}$ was maintained at 2000 mV. The null values were reproducible within 8 mV, suggesting that they are a reasonable measure of the depolarization fraction.

ZrO$_2$/Ni Film

Figure 31:
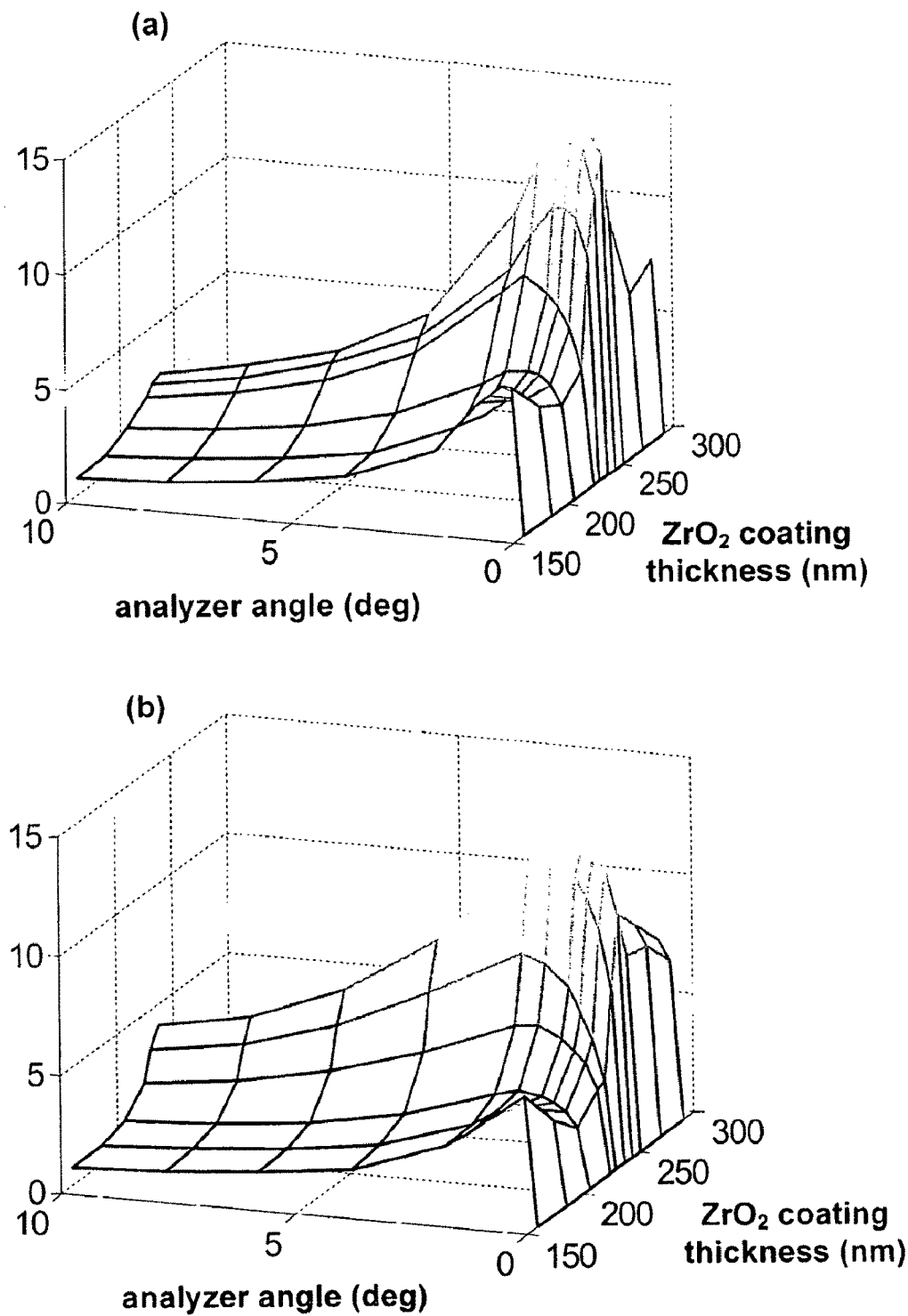
FIG. 31 shows measured Kerr contrast curves for a gradient thickness $ZrO_2$ film deposited on 42.5 nm of Ni as a function of analyzer angle and $ZrO_2$ thickness.

The ΔI/$I_{avg}$ behavior as a function of film thickness and analyzer angle was measured for a 42.5 nm film of Ni with a gradient thickness overlayer of ZrO$_2$ (index=2.05). The data mirror the calculations, as shown in FIG. 31, but with some minor differences. There is a factor of 2-2.5 times enhancements in the contrast obtained with the overcoat of ZrO$_2$, in accord with the model, and there are interference peaks in the thickness vs. contrast curves. The peak enhancement occurs at slightly larger analyzer angles for s-polarization than for p-polarization, as predicted by the calculations. However, there is a notable asymmetry in the data on the two sides of the enhancement peak. In particular, the drop-off in the signal with thickness is slower, and the width of the peak with respect to analyzer angle is greater on the high thickness side of the enhancement peak. This behavior is clearly correlated with a measured asymmetry in the values of the depolarization leakage that were measured when the signal was nulled at each thickness value.

Figure 32:
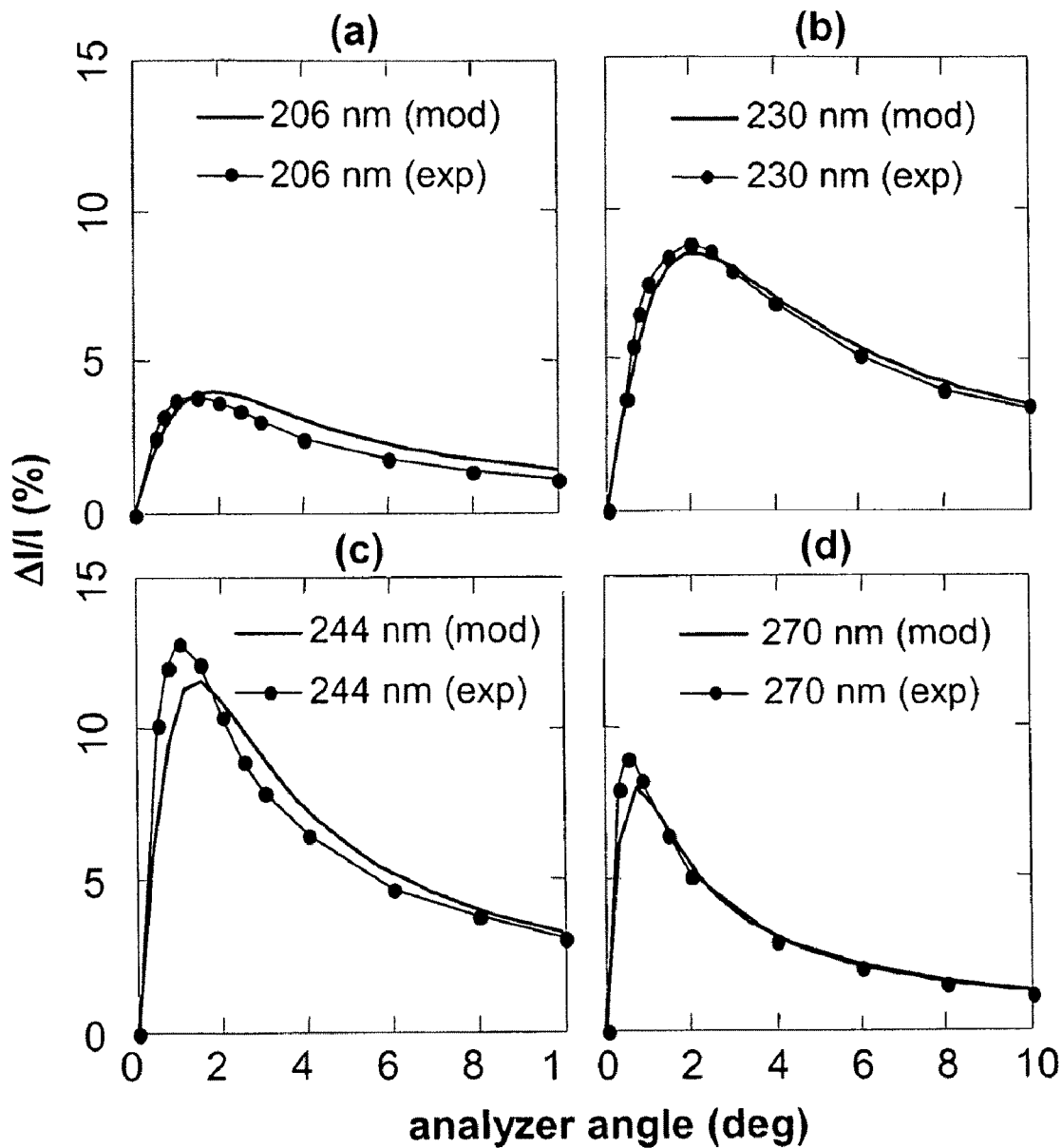
FIG. 32 shows a comparison of modeled and experimental data, where a depolarization factor for each $ZrO_2$ thickness is determined from measured residual intensity during a nulling process.

The minimum (null) signal was recorded at each thickness, which was used to derive a value for γ, based on a multiplicative increase over the value (10$^{-4}$) obtained for the bare Ni film. Using these modified γ values, the analyzer angle response at several thicknesses was modeled. The results are shown in FIG. 32. Asymmetry in the data is well reproduced. A source of excess depolarization on the high thickness side is believed to be related to a multitude of planes of incidence from the focusing lens, with additional phase shifts being introduced by the coating.

Metal-Dielectric Coating

Experiments were performed on a metal-dielectric coating on a thin Ni layer deposited on opaque aluminum. For this example, a film stack consisted of 100 nm of Al on SiO$_2$, coated with 20 nm of Ni, a variable thickness layer of ZnS, and a crossed gradient layer of Au deposited on the ZnS. There were no fiducial marks on the films, so the exact thicknesses were inferred from optical behavior. ZnS and Au thickness determinations for the calculations were made based on matching the s- and p-polarized reflectivities of the structure. The qualitative features of the model, such as peak shifts to higher analyzer angles, and the Kerr angle sign change for the s-polarized signal, were observed in the film structures. However, contrast ratios were not noticably improved over those obtained with the dielectric coating.

Improvements in longitudinal Kerr contrast were measured and modeled for thin Ni films with simple anti-reflection coatings. $\Delta I/I_{avg}$ was taken as the key parameter, rather than the Kerr angle, and it was found that these quantities are optimized under different conditions. For opaque magneto-optic films, an anti-reflection coating is important to enhancing $\Delta I/I_{avg}$. While the model suggests that reduction in the unrotated reflectance component ($R_{ss}$ or $R_{pp}$) can be accommodated by measurement at higher analyzer angles, it was found that there is increased depolarization under the conditions that favor measurement at large analyzer angles, which reduces the overall contrast attainable.

Using a single overcoat of $ZrO_2$, an improvement in $\Delta I/I_{avg}$ of a factor of 2.5 at an incidence angle of 45 degrees for both polarizations was calculated. Experimentally, for p-polarization, an improvement of a factor of 2.45 was measured, while for s-polarization, the enhancement measured was only 2.14. Increasing the incidence angle to 65 degrees is expected to lead to an enhancement of a factor of 3. The metal/dielectric coating is thus predicted to have slightly superior (5% better) performance at this higher angle of incidence.

Changes may be made in the above methods and devices without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present devices and methods, which, as a matter of language, might be said to fall there between.

What is claimed is:

1. A micromagnetic logic device, comprising:
   a plurality of micromagnetic elements physically linked to one another by one or more magnetic connectors, wherein at least one of the micromagnetic elements comprises an optical coating covering at least a portion of the micromagnetic element.

2. The micromagnetic logic device of claim 1, wherein at least one of the micromagnetic elements comprises a structural defect selected from a notch, a hole and an asymmetric structure.

3. The micromagnetic logic device of claim 1, wherein the optical coating is selected from the group consisting of vacuum deposited dielectrics and metals and spin coated polymers.

4. The micromagnetic element of claim 1, wherein the optical coating has a gradient thickness.

5. A two-dimensional array comprising a plurality of the micromagnetic logic devices of claim 1.

6. The two-dimensional array of claim 5, further comprising electrically conductive, non-magnetic strip lines that intersect the micromagnetic logic devices.

7. A micromagnetic logic device, comprising:
   a plurality of micromagnetic elements physically linked to one another, wherein at least one of the micromagnetic elements comprises an optical coating covering at least a portion of the micromagnetic element, and
   a pair of ellipsoids positioned proximal to at least one of the micromagnetic elements, wherein the pair of ellipsoids influences a magnetic state of the micromagnetic element.

8. A two-dimensional array comprising a plurality of the micromagnetic logic devices of claim 7.

9. The two-dimensional array of claim 8, further comprising electrically conductive, non-magnetic strip lines that intersect one or more of the micromagnetic logic devices and the pair of ellipsoids.

10. A micromagnetic logic device comprising:
    a plurality of micromagnetic elements physically linked to one another, wherein at least one of the micromagnetic elements comprises an optical coating covering at least a protion of the micromagnetic element; and
    three micromagnetic elements having a V-shaped geometry,
    wherein the device performs NOR and NAND operations.

11. A micromagnetic logic device, comprising:
    a plurality of micromagnetic elements physically linked to one another, wherein at least one of the micromagnetic elements comprises an optical coating covering at least a protion of the micromagnetic element; and
    five micromagnetic elements having a symmetrical V-shaped geometry,
    wherein the device performs OR and AND operations.

12. A micromagnetic logic device, comprising:
    a plurality of micromagnetic elements physically linked to one another, wherein at least one of the micromagnetic elements comprises an optical coating covering at least a protion of the micromagnetic element; and
    seven micromagnetic elements having an X-shaped geometry,
    wherein the device performs NOR, NAND, OR and AND operations.

13. The micromagnetic logic device of claim 1, wherein at least one of the micromagnetic elements is a toroid.

14. The micromagnetic logic device of claim 13, wherein the toroid has an outer diameter between 10-1000 nm.

15. The micromagnetic logic device of claim 13, wherein the toroid has a thickness between 125 pm and 100 nm.

16. A method of forming a micromagnetic logic device, comprising:
    providing a plurality of interconnected micromagnetic elements on a substrate,
    coating at least a portion of at least one of the micromagnetic elements with an optical coating, and
    providing at least one pair of ellipsoids proximal to one of the micromagnetic elements, where the ellipsoids influence the magnetic state of the micromagnetic element.

17. A method of using a micromagnetic logic device to perform a logic operation, comprising:
    providing a first external magnetic field having a first direction of magnetization, the first external magnetic field magnetically saturating a first micromagnetic element and a second micromagnetic element of the logic device, wherein the first micromagnetic element and the second micromagnetic element are joined;
    reducing the first external magnetic field, thereby forcing the first and second micromagnetic elements to adopt onion configurations; and
    applying a second external magnetic field proximal to the first micromagnetic element, the second external magnetic field having a direction of magnetization that is perpendicular to the first direction of magnetization, thereby inducing a clockwise or counter clockwise vortex state in the first micromagnetic element and an opposite vortex state in the second micromagnetic element.

18. The method of claim 17, further comprising detecting the vortex state of at least one of the first and second micromagnetic elements.

19. The method of claim 18, wherein the step of detecting the vortex state comprises:
    measuring an optical signal received from at least one of the first and second micromagnetic elements which is at least partially covered with an optical coating; and
    determining the magnetic state of the at least one micromagnetic element based upon the measured signal.

* * * * *